United States Patent [19]
Honma

[11] Patent Number: 5,557,646
[45] Date of Patent: Sep. 17, 1996

[54] MULTIPATH ELIMINATING FILTER

[75] Inventor: Souichi Honma, Yokohama, Japan

[73] Assignee: Kabushiki Kaisha Kenwood, Tokyo, Japan

[21] Appl. No.: 451,502

[22] Filed: May 26, 1995

[30] Foreign Application Priority Data

Jun. 4, 1994 [JP] Japan .................................. 6-145615

[51] Int. Cl.$^6$ ............................ H03D 1/04; H04B 7/10; H04B 1/10
[52] U.S. Cl. .......................... 375/346; 375/347; 375/350; 375/232; 455/307
[58] Field of Search .................................... 375/350, 346, 375/230, 231, 232, 233; 364/724.19, 724.2; 455/52.3, 63, 296, 307, 340, 266, 42

[56] References Cited

U.S. PATENT DOCUMENTS

| | | | |
|---|---|---|---|
| 5,233,633 | 8/1993 | Baum et al. | 375/232 |
| 5,268,930 | 12/1993 | Sendyk et al. | 375/233 |

Primary Examiner—Stephen Chin
Assistant Examiner—Huong Luu
Attorney, Agent, or Firm—Sixbey, Friedman, Leedom & Ferguson, P.C.; Gerald J. Ferguson, Jr.; Eric J. Robinson

[57] ABSTRACT

First, an adaptive filter 15 provided in a reflective wave detection unit 13 performs an adaptive operation on a digital signal inputted to an input terminal 10 for eliminating a multipath component from the digital signal. Also, a filter update unit 21 updates filter coefficient for a digital filter 18 comprising an FIR filter of lower degree. After the elapse of a predetermined time, reflective wave estimation unit 16 estimates reflection coefficient and delay time of a reflected wave contained in the digital signal from a filter coefficient at that point of time, and outputs the estimated values to a controller 14. Based on the input estimated values, the controller 14 initializes a delay time of a delay element of a digital filter 23 comprising an IIR filter of first degree of a multipath eliminating adaptive filter 11 and a multiplication coefficient of a multiplication element of the same. Then, the controller 14 causes the multipath eliminating adaptive filter 11 to performance adaptive filter for eliminating a multipath component.

6 Claims, 15 Drawing Sheets

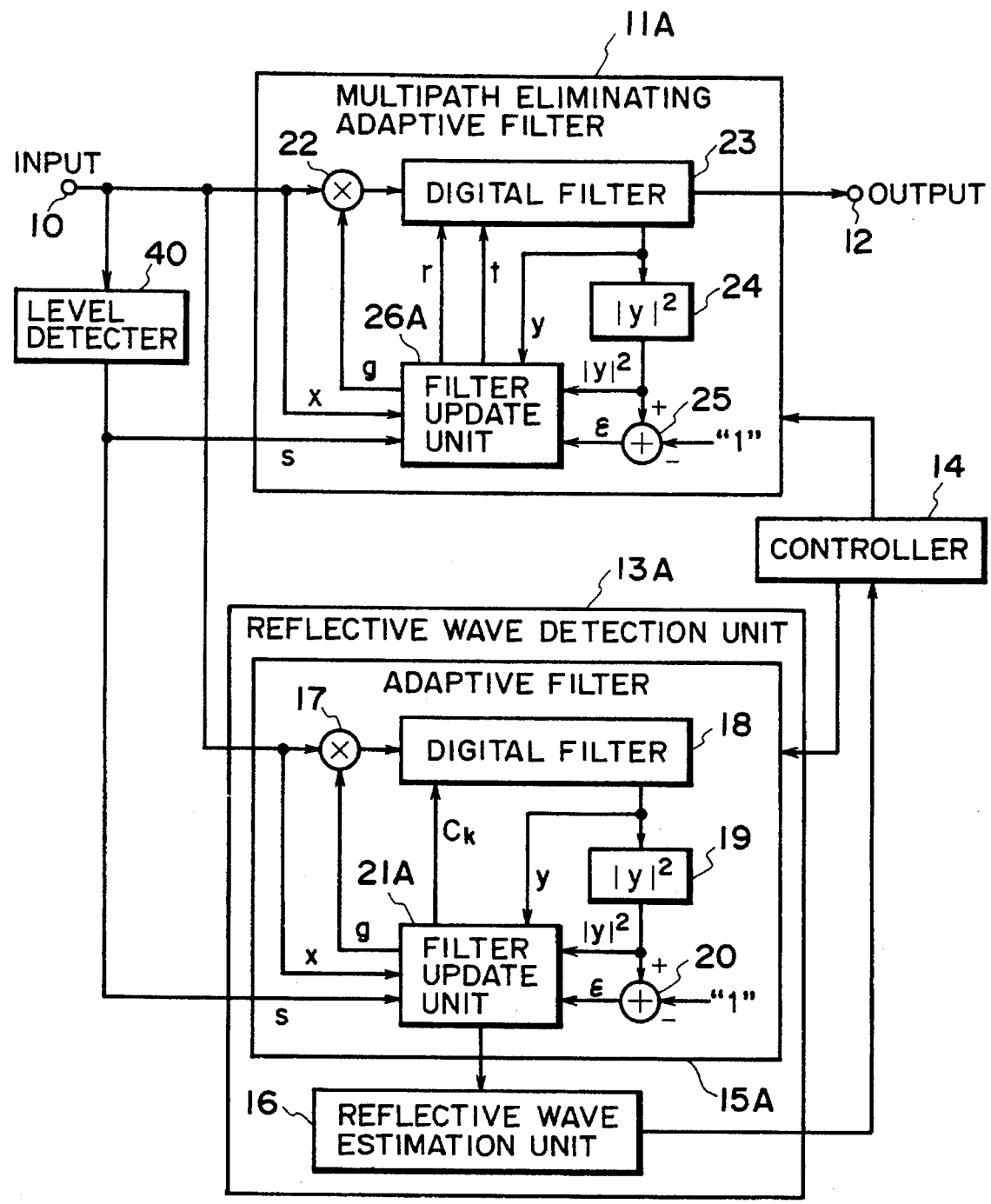
F I G. 7

MULTIPATH ELIMINATING FILTER

BACKGROUND OF THE INVENTION

1. Field of the Invention

The present invention relates to a multipath eliminating filter, and particularly to a multipath eliminating filter which eliminates a multipath component arising at reception of an FM modulated signal or a phase modulated signal using an adaptive filter having variable filter characteristics.

2 Description of Prior Art

When an FM modulated signal or a phase modulated signal is to be received and demodulated, it is known that multipath transmission (multipath), where an undesirable reflected wave component caused by a building, mountain or the like is superimposed on a direct wave component, takes place, causing a deterioration in quality of reception such as an increase in distortion of a demodulated signal and the like. For a stationary receiver, this problem can be coped with by sharpening directivity of an antenna for tuning in to a direct wave. This measure, however, is not applicable to a mobile receiver. Thus, for a mobile receiver, it is proposed that an adaptive filter is used as a method of eliminating multipath distortion. This method utilizes a property that an amplitude (envelope) of an FM modulated signal is fixed. A digital filter is inserted at an intermediate frequency stage preceding an amplifier limiter, thereby varying filter characteristics so that an output amplitude of the digital filter is fixed.

FIG. 17 shows an example of a conventional multipath eliminating adaptive filter. The filter of FIG. 17 comprises an FIR filter having sufficient degree as described in literature 1 below, for example.

Literature 1: J. R. Treichler, B. G. Agee: "A New Approach to Multipath Correction of constant Modulus Signals", IEEEE Trans. vol. ASSP-31, No. 2, pp 459–471 (1983)

In FIG. 17, a digital signal of an A/D converted intermediate frequency signal is inputted to input terminal IN. With a value at time n of the input digital signal taken as $x_n$, degree of an FIR (Finite Impulse Response) filter 1 as N, coefficient of the FIR filter 1 as $c_k$ (k=0 to N), and a value at time n of an output digital signal to be outputted to output terminal OUT as $Y_n$, $Y_n$ is expressed by $$y_n = \sum_{k=0}^{N} c_k x_{n-k}$$

Its matrix representation is $$y_n = C^T X$$

where $C^T = [C_0, C_1, C_2, \ldots, C_N]$, $X^T = [x_n, x_{n-1}, x_{n-2}, \ldots, x_{n-N}]$, and the superscript "T" represents a transposed matrix.

With a reference amplitude value taken as 1, error $\epsilon_n$ is expressed by $$\epsilon_n = |y_n|^2 - 1$$

In an adaptive algorithm, evaluating function F is expressed by $$F = E[\epsilon_n^2]$$

where E [*] indicates an expected value arithmetic.

Removal of multipath distortion is synonymous with minimization of F. Filter coefficient $c_k$ for minimizing F is determined by a steepest gradient of F. Hence, update filter coefficient $c_k$ as follows, for use at next time (n+1).

$$c_k \leftarrow c_k - \alpha(\partial F/\partial c_k)$$

where $\alpha$ is a fixed convergence parameter.

In the example of FIG. 17, an operator 2 squares an absolute value of $Y_n$, and a subtracter 3 subtracts a reference amplitude value of 1 from the absolute value squared to obtain $\epsilon_n$. A filter update unit 4 performs an expected value arithmetic and an update calculation on a filter coefficient. Thus, an updated filter coefficient is set for the FIR filter 1.

FIG. 18 shows another example of a multipath eliminating adaptive filter. The filter of FIG. 18 comprises an FIR filter having a nonzero filter coefficient only at points corresponding to integer multiples of a delay time of a reflected wave. Furthermore, a multiplier for level adjustment is provided on the subsequent stage side of the FIR filter for normalizing an amplitude of a direct wave to 1. It is described in literature 3 below as an improved version of an invention disclosed in literature 2.

Literature 2: Japanese Patent Application Laid-open No. 140527/1987

Literature 3: Japanese Patent Application Laid-open No. 62628/1991

When one reflected wave is involved and when a reflection coefficient at normalization by a direct wave is taken as r and a delay time of the reflected wave as t, transfer function $H_{MP}$ of multipath is represented by $$H_{MP}(z) = 1 + rz^{-t}$$

Transfer function $H_{EQ}$ to be realized by the multipath eliminating adaptive filter is an inverse function of $H_{MP}$ as represented by $$\begin{aligned} H_{EQ}(z) &= 1/(1+rz^{-t}) \\ &= 1 - rz^{-t} + r^2z^{-2t} - r^3z^{-3t} + \\ &\quad \ldots + (-r)^L z^{-Lt} + \ldots \end{aligned}$$

Thus, $H_{EQ}$ is realized at an FIR filter 5 by selecting an appropriate L.

In the example of FIG. 18, after squaring an absolute value of output $y_n$ from the FIR filter 5 at an operator 6, the absolute value squared is multiplied by a variable gain coefficient g at a level adjusting multiplier 7 for normalizing an amplitude of a direct wave to 1.

In this case, evaluating function F in an adaptive algorithm is expressed by $$\begin{aligned} F &= E[\epsilon_n^2] \\ &= E[g|y_n|^2 - 1] \end{aligned}$$

A subtracter 8 subtracts 1 from an output of the multiplier 7 to obtain error $\epsilon_n$ and outputs it to a filter update unit 9.

Update expressions for updating r, t, and g by a method of steepest gradient are $$r \leftarrow r - \alpha_1 (\partial F/\partial r)$$

$$t \leftarrow t - \alpha_2 (\partial F/\partial t)$$

$$g \leftarrow g - \alpha_3 (\partial F/\partial g)$$

where $\alpha_1 - \alpha_3$ are fixed convergence parameters.

The filter update unit 9 performs an expected value arithmetic and an update calculation on r, t, and g. Thus, updated filter characteristics r and t are set for the FIR filter 5, and an updated gain coefficient g is set for the multiplier 7.

If a unit delay time (here, a sampling period for a digital signal) u of a delay element of the FIR filter 5 is fixed and is far smaller than t, filter coefficient $c_k$ is obtained from r and t by the following expressions:

$$c_k = (-r)^p \quad k = p$$

$$c_k = 0 \quad k \neq p$$

The obtained $c_k$ is set for the FIR filter 5 as an update filter coefficient. p=[vt/u] (v is a variable assuming an integer greater than 0), and a maximum integer not exceeding vt/u.

SUMMARY OF THE INVENTION

A multipath eliminating filter shown in FIG. 17 is characterized in that if convergence parameter α is sufficiently small, convergence is possible irrespective of an initial value of a filter coefficient. However, it had a problem that normally required degree N is very large, 128–256, causing a larger circuit scale and a longer time required for convergence.

On the other hand, a multipath eliminating filter shown in FIG. 18 has a possibility of reducing a circuit scale and of quickening the convergence of filter characteristics. However, it had a problem that a failure to select proper initial values may cause a failure in convergence due to a mutual influence of three parameters r, t, and g.

In view of the above-mentioned prior art, it is an object of the present invention to attain secure convergence in a short period of time.

An aspect of the present invention is characterized by comprising: a multipath eliminating adaptive filter comprising a digital filter having variable filter characteristics to which an FM modulated or phase modulated digital signal containing a multipath component is inputted and which performs a filter arithmetic process on the input digital signal to eliminate the multipath component therefrom, error detection means for obtaining an error between an amplitude of a digital signal outputted from the digital filter and a reference amplitude value, level adjustment means allowing an amount of adjustment to be varied for adjusting an amplitude level of a digital signal, and update means which calculates filter characteristics and an amount of level adjustment for minimizing an error detected by the error detection means and which updates filter characteristics for the digital filter and an amount of level adjustment for the level adjustment means; reflective wave detection means for detecting characteristics of a reflected wave from the input digital signal or an output digital signal of the multipath eliminating adaptive filter; and control means which initializes the digital filter of the multipath eliminating adaptive filter to initial filter characteristics corresponding to characteristics of a reflected wave detected by the reflective wave detection means and which then starts an adaptive operation at the multipath eliminating adaptive filter.

Another aspect of the present invention is characterized in that the reflective wave detection means comprises: an adaptive filter comprising a digital filter having variable filter characteristics which performs a filter arithmetic process on the input digital signal or the output digital signal of the multipath eliminating adaptive filter, error detection means for obtaining an error between an amplitude of a digital signal outputted from the digital filter and a reference amplitude value, level adjustment means allowing an amount of adjustment to be varied for adjusting an amplitude level of a digital signal, and update means which calculates filter characteristics and an amount of level adjustment for minimizing an error detected by the error detection means and which updates filter characteristics for the digital filter and an amount of level adjustment for the level adjustment means; and reflective wave estimation means for estimating characteristics of a reflected wave from filter characteristics of the digital filter of the adaptive filter at a point of time when an error in the adaptive filter becomes small to a certain extent.

A further aspect of the present invention is characterized by comprising: level detection means for detecting a level of the digital signal to be inputted to said multipath eliminating adaptive filter; and level adjustment amount initialization means for initializing, when an adaptive operation of the multipath eliminating adaptive filter is to be started, the level adjustment means of the multipath eliminating adaptive filter to an amount of level adjustment inversely proportional to a level of a digital signal detected by the level detection means.

Still another aspect of the present invention is characterized by comprising: level detection means for detecting a level of the digital signal to be inputted to the reflective wave detection means; and level adjustment amount initialization means for initializing, when an adaptive operation of the adaptive filter of the reflective wave detection means is to be started, the level adjustment means of the adaptive filter to an amount of level adjustment inversely proportional to a level of a digital signal detected by the level detection means.

A still further aspect of the present invention is characterized by comprising connection selector means for cascade connecting the adaptive filter of the reflective wave detection means to the multipath eliminating adaptive filter at a subsequent stage thereto after an adaptive operation of the multipath eliminating adaptive filter is started.

A still further aspect of the present invention is characterized in that the digital filter of the multipath eliminating adaptive filter comprises an IIR (Infinite Impulse Response) filter of first degree in single stage or IIR filters of first degree which are cascade connected in more than one stage.

According to an aspect of the present invention, characteristics of a reflected wave are detected from an input digital signal or an output digital signal of a multipath eliminating adaptive filter. A digital filter of the multipath eliminating adaptive filter is initialized to initial filter characteristics corresponding to the detected characteristics of a reflected wave before starting an adaptive operation of the multipath eliminating adaptive filter. Thus, it is possible for the multipath eliminating adaptive filter to start a filter arithmetic under an appropriate initial state suited to characteristics of a reflected wave. Also, an amplitude of a digital signal output is converged quickly and securely to a predetermined value, thereby obtaining a reception output with a multipath component eliminated therefrom.

According to another aspect of the present invention, an input digital signal or an output digital signal from the multipath eliminating adaptive filter is led to an adaptive filter for estimating characteristics of a reflected wave from filter characteristics of a digital filter of the adaptive filter at a point of time when an error between an output amplitude of the adaptive filter and a reference amplitude value becomes small to a certain extent. Since the adaptive filter used for estimating characteristics of a reflected wave is not intended to eliminate multipath distortion, but is intended to estimate characteristics of a reflected wave, it adapts itself to a smaller circuit scale and can be implemented in a simple construction.

According to a further aspect of the present invention, a level of a digital signal to be inputted to the multipath eliminating adaptive filter is detected, and level adjustment means of the multipath eliminating adaptive filter is to be initialized to a level adjustment amount inversely proportional to the level of a digital signal when an adaptive operation of the multipath eliminating adaptive filter is started. Thus, an adaptive operation of the multipath eliminating adaptive filter can be started at an appropriate initial amount of level adjustment. Also, convergence can be attained in a short period of time even when the difference between an amplitude of a direct wave and a reference amplitude is large.

According to still another aspect of the present invention, a level of a digital signal to be inputted to reflective wave detection means is detected, and level adjustment means of an adaptive filter of the reflective wave detection means is initialized to a level adjustment amount inversely proportional to the level of a digital signal when an adaptive operation of the adaptive filter of the reflective wave detection means is to be started. Thus, an adaptive operation of the adaptive filter can be started at an appropriate initial amount of level adjustment. Also, even when the difference between an amplitude of a direct wave and a reference amplitude is large, characteristics of a deflected wave can be detected in a short period of time, and the multipath eliminating adaptive filter can be initialized accordingly before starting an adaptive operation.

According to a still further aspect of the present invention, the adaptive filter of the reflective wave detection means is cascade connected to the multipath eliminating adaptive filter at a subsequent stage thereto after an adaptive operation of the multipath eliminating adaptive filter is started. Thus, a remaining reflected wave component which the multipath eliminating adaptive filter has failed to eliminate can be eliminated by the adaptive filter of the reflective wave detection means.

According to a still further aspect of the present invention, the digital filter of the multipath eliminating adaptive filter comprises an IIR filter of first degree in single stage or IIR filters of first degree which are cascade connected in more than one stage. Thus, a circuit scale can be greatly reduced.

BRIEF DESCRIPTION OF THE DRAWINGS

FIG. 7 is a circuit diagram illustrating a multipath eliminating filter according to a second embodiment of the present invention.

EMBODIMENTS

Figure 1:
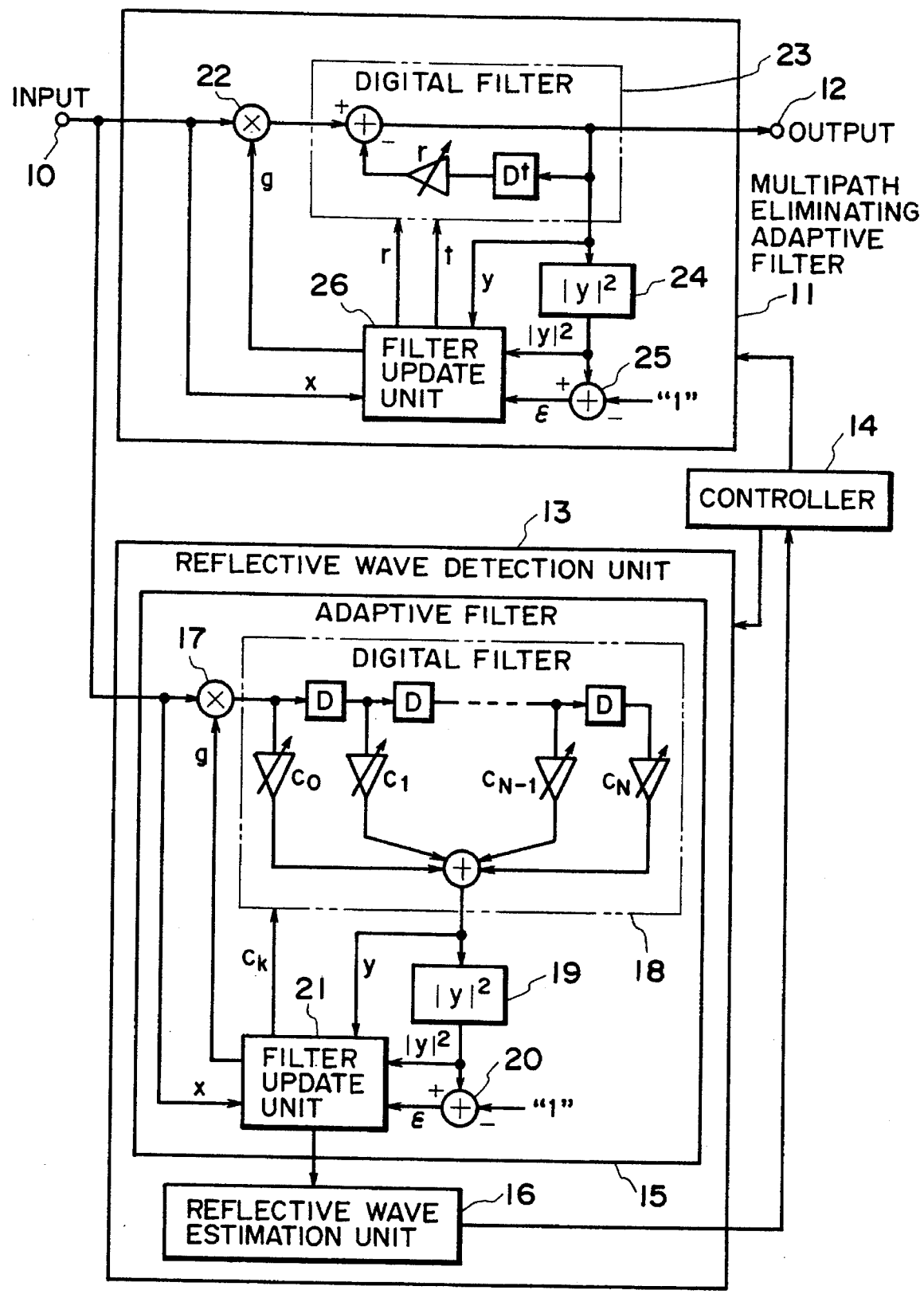
FIG. 1 is a circuit diagram illustrating a multipath eliminating filter according to a first embodiment of the present invention.

FIG. 1 is a circuit diagram showing a multipath eliminating filter according to a first embodiment of the present invention.

Reference numeral 10 denotes an input terminal to which a digital signal generated by A/D converting an FM modulated or phase modulated intermediate frequency signal containing a multipath component is inputted; 11, a multipath eliminating adaptive filter which varies filter characteristics thereof successively and adaptively using a property that an amplitude of an FM modulated or phase modulated wave is fixed and which eliminates a multipath component from the input digital signal before outputting the signal; 12, an output terminal for outputting the digital signal with a multipath component eliminated therefrom to a subsequent stage; 13, a reflective wave detection unit which detects characteristics (reflection coefficient r indicative of a reflective wave level with reference to a direct wave and delay time t of a reflected wave with reference to a direct wave) of a reflected wave component contained in a digital signal before the multipath eliminating adaptive filter is put in operation; and 14, a controller which controls the start of an adaptive operation of an adaptive filter, described later, and the multipath eliminating adaptive filter and which initializes a digital filter of the multipath eliminating adaptive filter to initial filter characteristics corresponding to characteristics of a reflected wave component.

The reflective wave detection unit 13 comprises an adaptive filter 15 which varies filter characteristics thereof successively and adaptively using a property that an amplitude of an FM modulated or phase modulated wave is fixed and which performs an operation of eliminating a multipath component from the input digital signal, and a reflective wave estimation unit 16 to which filter characteristics at a point of time when the adaptive filter 15 has carried out an adaptive operation for a predetermined time are inputted to estimate reflected wave characteristics (r, t).

In the adaptive filter 15, reference numeral 17 denotes a multiplier allowing an adjustment amount (=gain coefficient g) for adjusting an amplitude level of the input digital signal to be varied; 18, a digital filter comprising an FIR filter having a variable filter coefficient; 19, an operator which squares an absolute value of an output from the digital filter 18; 20, a subtracter which subtracts a reference amplitude value of 1 from an output from the operator 19 to obtain an error; and 21, a filter update unit which obtains update values of gain coefficient and filter coefficient from an output from the subtracter 20 and the like by a method of steepest gradient and which sets thus obtained update values for the digital filter 18.

Operations of the adaptive filter 15 and the reflective wave estimation unit 16 will now be described. With a value at time n of an input digital signal taken as $x_n$, a gain coefficient of the multiplier 17 as g, degree of the digital filter 18 as N, a coefficient of the digital filter 18 as $c_k$ (k=0 to N), and a value at time n of a digital signal outputted from the digital filter 18 as $y_n$, the following expression will hold.

$$y_n = g C^T X$$

where $C^T = [c_0, c_1, c_2, \ldots, c_N]$, and $X^T = [x_n, x_{n-1}, x_{n-2}, \ldots, x_{n-N}]$.

Error $\epsilon_n$ at a reference amplitude value of 1 is expressed by $$\epsilon_n = |y_n|^2 - 1$$

Evaluating function F in an adaptive algorithm is expressed by $$F = E[\epsilon_n^2]$$

When a method of steepest gradient (LMS algorithm) is applied with an instantaneous value arithmetic substituted for an expected value arithmetic, update expressions for gain coefficient g and filter coefficient C are as follows:

$$g \leftarrow g - \alpha_1(\partial F/\partial g) = g - 4\alpha_1 \epsilon_n(|y_n|^2/g) \quad (1)$$

$$\approx g - 4\alpha_1 \epsilon_n |y_n|^2 \quad (1)'$$

$$C \leftarrow C - \alpha_2(\partial F/\partial C) = C - 2\alpha_2 \epsilon_n g X^* y_n \quad (2)$$

where the superscript "*" indicates conjugate complex, and $\alpha_1$ and $\alpha_2$ are convergence parameters.

When multipath is to be eliminated, the controller 14, first, initializes the multiplier 17 of the adaptive filter 15 to g=1 and the digital filter 18 to $C=[c_0=1, c_1=0, c_2=0, \ldots, c_N=0]$, and also initializes the filter update unit 21 to the same value. Then, the controller 14 causes the adaptive filter 15 to start an adaptive operation. During an adaptive operation, the filter update unit 21 successively updates gain coefficient g and filter coefficient C for the multiplier 17 and the digital filter 18 in accordance with expressions (1) and (2).

In view of the fact that g varies in the 0.3–3.0 range and that omitting division by g in expression (1) does not have much effect on a convergence characteristic, expression (1)' may be used in place of expression (1) for updating gain coefficient g. This will lighten the burden of the filter update unit 21 in terms of circuit construction.

Since the digital filter 18 of the adaptive filter 15 is an FIR filter, it can eliminate a multipath component from an input digital signal in a stable operation after starting an adaptive operation. Thus, after the elapse of a predetermined time, error $\epsilon_n$ becomes small to a certain extent or more. At this point of time, filter coefficients $c_k$ assume an absolute value of diversified magnitude. With a unit delay time of a delay element of the digital filter 18 taken as u and a delay time of a reflected wave with respect to a direct wave as t', filter coefficient $c_k$ with k closest to t'/u except $c_0$ works most effectively in eliminating a reflected wave component and assumes a largest absolute value.

The reflective wave estimation unit 16 takes in filter coefficient C which is set in the digital filter 18, from the filter update unit 21 after the elapse of a predetermined time after the adaptive filter 15 has started an adaptive operation. Also, the reflective wave estimation unit 16 selects one filter coefficient $c_m$ having a maximum absolute value except $c_0$. The reflective wave estimation unit 16, then, estimates characteristics of a reflected wave taking an absolute value of $c_m$ as reflection coefficient r and mu as delay time t, and outputs the estimation data to the controller 14.

Figure 17:
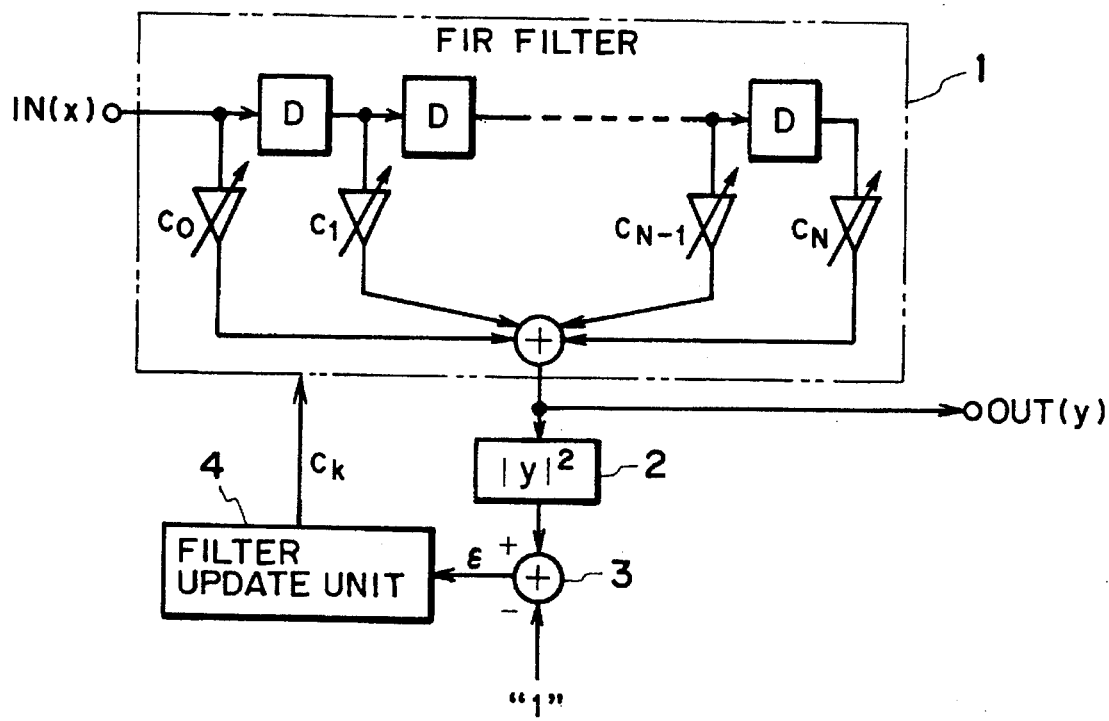
FIG. 17 is a circuit diagram illustrating a conventional multipath eliminating filter.
Figure 18:
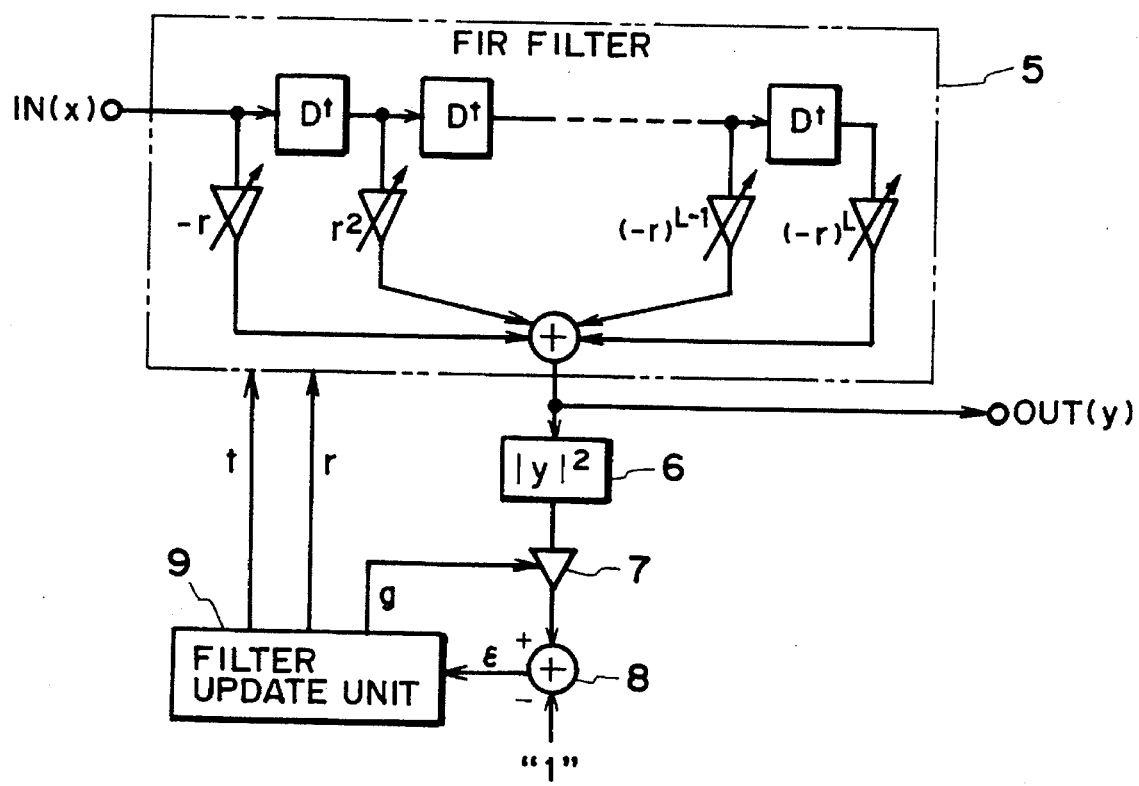
FIG. 18 is a circuit diagram illustrating another conventional multipath eliminating filter.

Since the digital filter 18 is not intended to eliminate multipath distortion, but is intended to estimate characteristics of a reflected wave, degree N of 16–32 is sufficient. In comparison with the prior art shown in FIG. 17, degree N is far smaller, and hence a circuit scale becomes smaller.

According to the present embodiment, the reflective wave estimation unit 16 takes in filter coefficients of the digital filter 18 after the elapse of a predetermined time after the adaptive filter 15 has started an adaptive operation, for estimating characteristics of a reflected way. However, the reflective wave estimation unit 16 may monitor error $\epsilon_n$ outputted from the subtracter 20 of the adaptive filter 15 and may take in filter coefficients of the digital filter 18 when $\epsilon_n$ becomes a certain predetermined value or less, for estimating characteristics of a reflected wave.

In the multipath eliminating adaptive filter 11, reference numeral 22 denotes a multiplier allowing an adjustment amount (=gain coefficient g) for adjusting an amplitude level of an input digital signal to be varied; 23, a digital filter comprising an IIR filter of first degree allowing a delay time of a delay element and a multiplication coefficient of a multiplication element to be varied; 24, an operator which squares an absolute value of an output from the digital filter 23; 25, a subtracter which subtracts a reference amplitude value of 1 from an output from the operator 24 to obtain an error; and 26, a filter update unit which obtains update values of gain coefficient, delay time, and multiplication coefficient from an output from the subtracter 25 and the like by a method of steepest gradient and which sets thus obtained update values for the digital filter 23.

Operations of the multipath eliminating adaptive filter 11 will now be described.

An IIR filter of first degree can be considered as a large FIR filter of degree L having filter coefficient $c_k$ expressed below.

$$c_k = (-r)^p \quad k = p$$

$$c_k = 0 \quad k \neq p$$

With a unit delay time of a delay element in the FIR filter taken as u, p=[vt/u] (v is a variable assuming an integer greater than 0), a maximum integer not exceeding vt/u.

With a value at time n of an input digital signal taken as $x_n$, a gain coefficient of the multiplier 22 as g, a coefficient of the digital filter 23 considered as an FIR filter as $c_k$ (k=0 to L), and a value at time n of a digital signal outputted from the digital filter 23 as $y_n$, the following expression will hold as for the adaptive filter 15.

$$y_n = g C^T X$$

where $C^T = [c_0, c_1, c_2, \ldots, C_L]$, and $X^T = [x_n, x_{n-1}, x_{n-2}, \ldots, x_{n-L}]$.

Error $\epsilon_n$ at a reference amplitude value of 1 is expressed by $$\epsilon_n = |y_n|^2 - 1$$

Evaluating function F in an adaptive algorithm is expressed by $F = E[\epsilon_n^2]$ When a method of steepest gradient (LMS algorithm) is applied with an instantaneous value arithmetic substituted for an expected value arithmetic, update expressions for gain coefficient g of the multiplier 22, multiplication coefficient r of a multiplication element of the digital filter 23, and delay time t of a delay element are as follows:

$$g \leftarrow g - \beta_1(\partial F/\partial g) = g - 4\beta_1\epsilon_n(|y_n|^2/g) \quad (4)$$

$$\approx g - 4\beta_1\epsilon_n|y_n|^2 \quad (4)'$$

$$r \leftarrow r - \beta_2(\partial F/\partial r) = r - 4\beta_2\epsilon_n y_n(gX^T\partial C/\partial r)^* \quad (5)$$

$$t \leftarrow t - \beta_3(\partial F/\partial t) = t - 2\beta_3\epsilon_n R_e\{y_n^*(gC^T(\partial X/\partial t)\} \quad (6)$$

where $\beta_1$–$\beta_3$ are convergence parameters. $\partial C/\partial r$ in expression (5) is as follows:

$$\partial c_k/\partial r = -p\,(-r)^{p-1} \quad k=p$$

$$\partial c_k/\partial r 0 \quad k \neq p$$

Also, $\partial x_k/\partial t$ in expression (6) is expressed as below using cubic Lagrangian interpolation.

$$\partial x_k/\partial t \approx (k/2t)(x_{k+1} - x_{k-1})$$

(Refer to literature 2, lower right column on p. 142 to upper left column on p. 144)

When the controller 14 causes the adaptive filter 15 to start an adaptive operation, it sets gain coefficient g=1 for the multiplier 22 of the multipath eliminating adaptive filter 11 and multiplication coefficient r=0 for the digital filter 23, and also puts the multipath eliminating adaptive filter in operation with a transfer function thereof fixed to 1 (an adaptive operation thereof is not started yet).

Then, when the controller 14 takes in reflection coefficient r and delay time t from the reflective wave estimation unit 16, it takes them as initial filter characteristics and initializes the digital filter 23 of the multipath eliminating adaptive filter and the filter update unit 26 to the input values. Then, the controller 14 causes the multipath eliminating adaptive filter 11 to start an adaptive operation. Y (a fixed value greater than 1) times the reflection coefficient r inputted from the reflective wave estimation unit 16 may be used as an initial value for the initialization.

During an adaptive operation, the filter update unit 26 successively updates gain coefficient g for the multiplier 22, multiplication coefficient r for the digital filter 23, and delay time t in accordance with expressions (4), (5), and (6), respectively. Expression (4)' may be used in place of expression (4).

Although the digital filter 23 is an IIR filter, since it is initialized to optimum filter characteristics corresponding to characteristics of a reflected wave at a point of time when an adaptive operation is started, it can stably carry out an adaptive operation. Thus, it accomplishes convergence quickly and outputs, after the elapse of a certain time, a digital signal with a multipath component eliminated therefrom from the output terminal 12. Since the digital filter 23 is an IIR filter of first degree, its circuit scale is very small.

Figure 2:
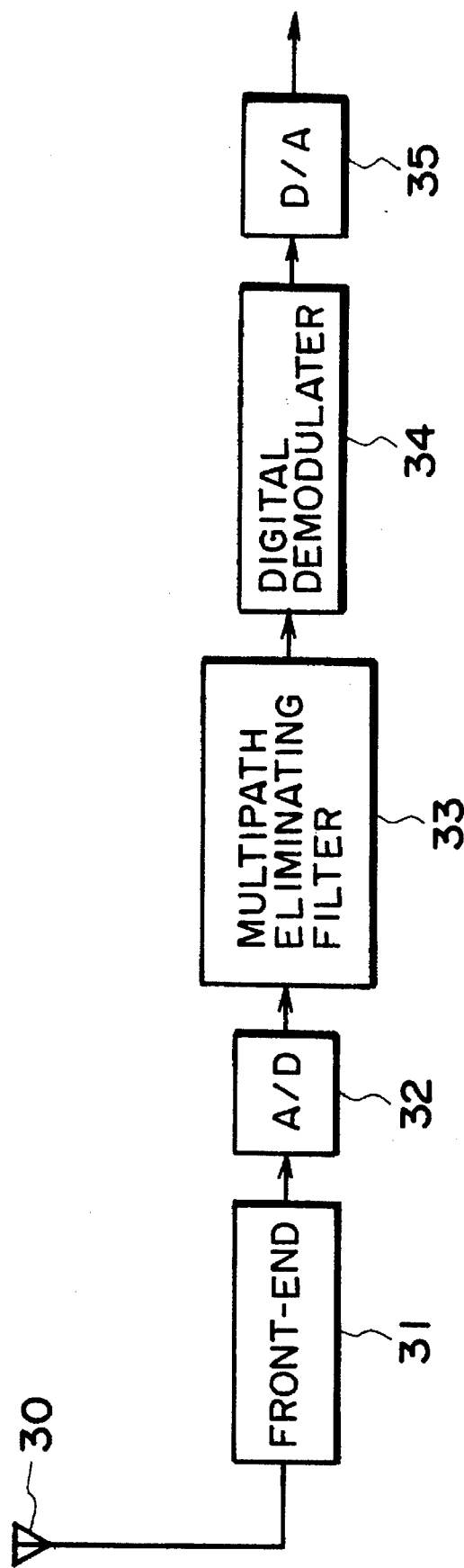
FIG. 2 is a circuit diagram showing an FM tuner fitted with a multipath eliminating filter.

FIG. 2 shows a circuit construction when a multipath eliminating filter according to the first embodiment is applied to an FM radio receiver. At a front-end 31, a high frequency signal of a desired station is extracted from a signal received at an antenna 30, and the high frequency signal is converted to an intermediate frequency signal, which is then outputted therefrom. The intermediate frequency signal is converted to a digital signal at an A/D converter 32. This digital signal contains a multipath component. The multipath component is eliminated at a multipath eliminating filter 33, which is constructed as shown in FIG. 1. Then, an audio signal is demodulated at a digital demodulator. The audio signal is converted to an analog audio signal at a D/A converter 35. The analog audio signal is outputted to a subsequent low frequency amplifier (not shown). Since a multipath component is eliminated from the audio signal, undistorted audio can be heard.

Figure 3:
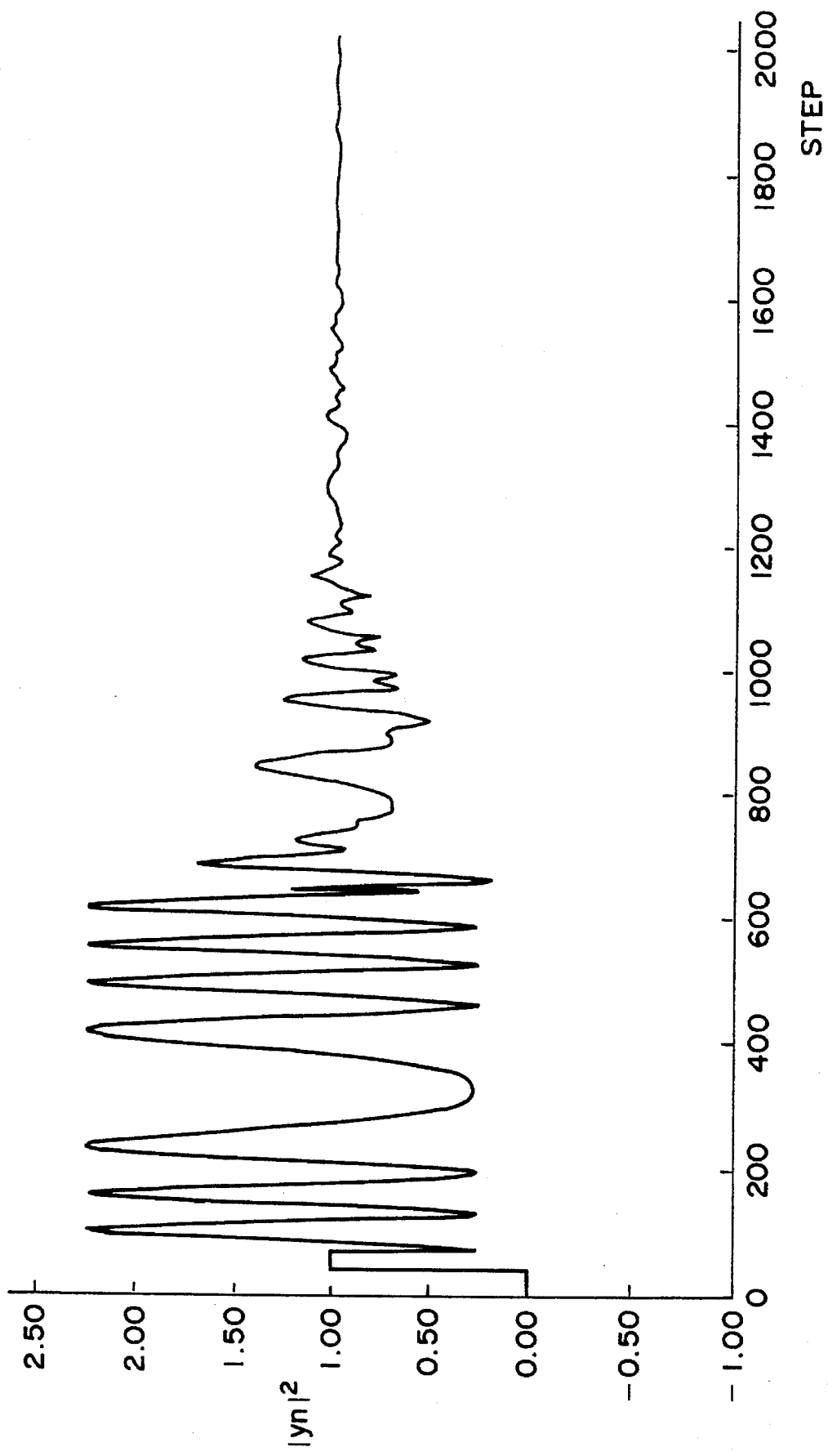
FIG. 3 is a graph illustrating the result of experiment of the multipath eliminating filter of FIG. 1.
Figure 4:
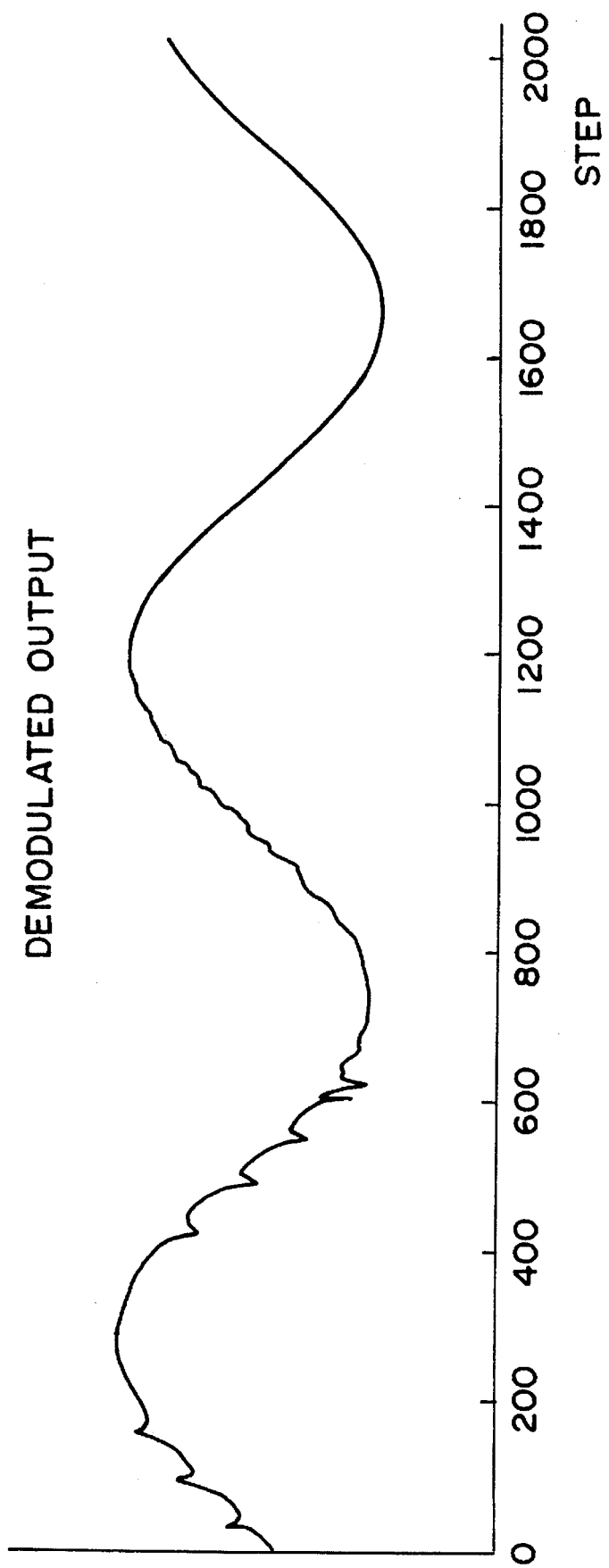
FIG. 4 is a graph illustrating the result of experiment of the multipath eliminating filter of FIG. 1.
Figure 5:
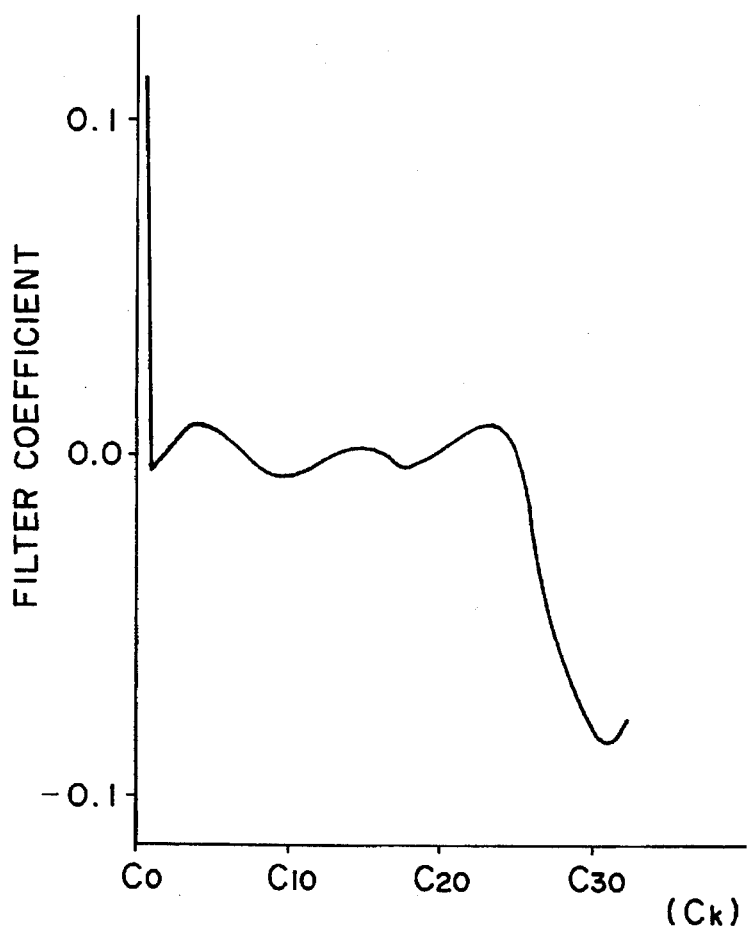
FIG. 5 is a graph illustrating the result of experiment of the multipath eliminating filter of FIG. 1.

FIG. 3 shows how $|y_n|^2$ changes at the output terminal 12 of the multipath eliminating filter when the FM radio receiver of FIG. 2 has received an FM modulated wave of a 1 kHz sine wave monaural signal to which one reflected wave is added. FIG. 4 shows how a demodulated output from the digital demodulator 34 changes. FIG. 5 shows values of filter coefficients ck of the digital filter 18 at a point of time when the reflective wave estimation unit 16 has estimated characteristics of a reflected wave.

Conditions established here are as follows: sampling frequency of the A/D converter 32=912 kHz; reflection coefficient r of a reflected wave=0.5; delay time=30 sampling periods; and degree N of the digital filter 18 of the adaptive filter 15=32. The multipath eliminating adaptive filter 11 is fixed to g=1 and r=0 as soon as an adaptive operation of the adaptive filter 15 starts. Then, the reflective wave estimation unit 16 estimates characteristics of a reflected wave based on a filter coefficient of the adaptive filter 15 at a point of time after the elapse of 600 steps. Based on the estimated values, the controller 14 initializes the multipath eliminating adaptive filter 11 and causes an adaptive operation thereof to start.

As seen from FIG. 5, filter coefficient $c_{30}$ shows a maximum absolute value at a point of time when 600 steps has elapsed after the start of an adaptive operation of the adaptive filter 15. This indicates a correspondence to delay time of a reflected wave=30 sampling periods.

Also, as seen from FIGS. 3 and 4, $|y_n|^2$ converges to a reference amplitude value of 1 at 1200 steps or so, and thus multipath distortion is eliminated from a demodulated output.

Figure 6:
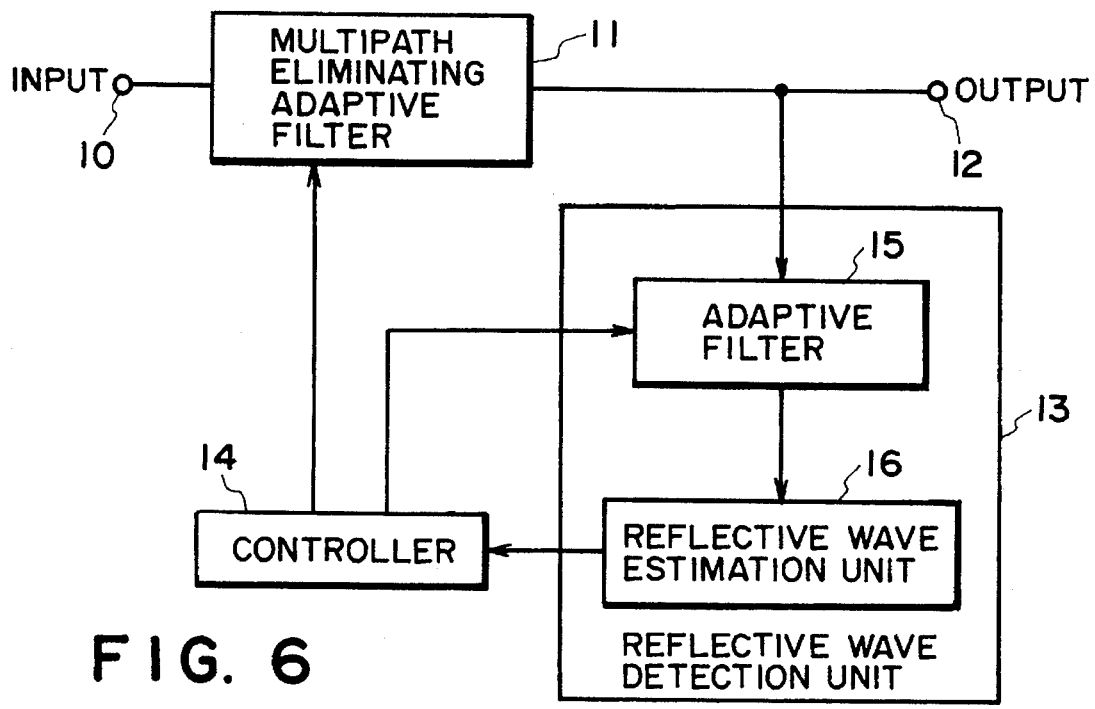
FIG. 6 is a circuit diagram illustrating a modified first embodiment.

FIG. 6 is a circuit diagram showing a multipath eliminating filter according to a modified first embodiment. The adaptive filter 15 is connected to the output side of the multipath eliminating adaptive filter 11. When the adaptive filter 15 is to perform an adaptive operation, if the controller 14 fixes a transfer function of the multipath eliminating adaptive filter 11 to 1, a digital signal inputted to the input terminal 10 is inputted intact to the adaptive filter 15. Thus, characteristics of a reflected wave can be estimated from a filter coefficient at a time when error $\epsilon_n$ in the adaptive filter 15 converges to a value within a predetermined range, in the same manner as in the case of FIG. 1.

FIG. 7 is a partially omitted circuit diagram showing a multipath eliminating filter according to a second embodiment of the present invention. The same component features as in FIG. 1 are denoted by common reference numerals.

Reference numeral 40 denotes a level detector which detects a level of a digital signal inputted to the input terminal 10 and which outputs a level detection signal to a filter update unit 21A of an adaptive filter 15A of a reflective wave detection unit 13A and to a filter update unit 26A of a multipath eliminating adaptive filter 11A. When an adaptive operation of the adaptive filter 15A is started, the filter update unit 21A initializes the multiplier 17 to gain coefficient g=1/s, where s is a level of an input digital signal at the time of starting the adaptive operation. This brings gain coefficient g to an adequate value corresponding to a level of the input digital signal. Thus, an adaptive operation can be started such that an amplitude of a digital signal to be inputted to the adaptive filter 15A becomes 1. Particularly, even when the difference between an amplitude value of a direct wave and a reference amplitude value of 1 is large, the adaptive filter 15A can be quickly put in convergence.

Likewise, when an adaptive operation of the multipath eliminating adaptive filter 11A is started, the filter update unit 26A initializes the multiplier 23 to gain coefficient g=1/s, where s is an input digital signal level at the time of starting the adaptive operation. Thus, an adaptive operation can be started at an adequate value of gain coefficient g corresponding to a level of the input digital signal. Particularly, even when the difference between an amplitude value of a direct wave and a reference amplitude value of 1 is large, the multipath eliminating adaptive filter 11A can be quickly put in convergence.

Figure 8:
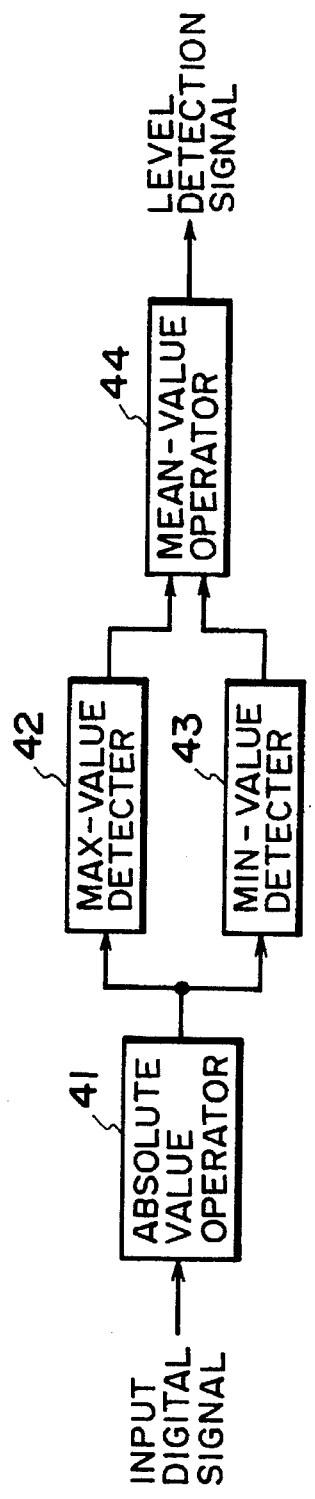
FIG. 8 is a circuit diagram specifically illustrating a level detection unit.

A specific circuit construction of the level detector 40 may be as shown in FIG. 8, for example. After an absolute value of an instantaneous value of an input digital signal is taken at an absolute value operator 41, a maximum value and a minimum value within a certain period are obtained at a max-value detector 42 and a mini-value detector 43, respectively. Then, a mean value of thus obtained maximum and minimum values is calculated at a mean-value operator 44 to output a level detection signal. Also, the absolute value operator 41 may be omitted. In this case, a maximum value and a minimum value among instantaneous values within a certain period may be obtained only for a positive-side input digital signal at the max-value detector and the min-value detector. Then, a mean value of thus obtained maximum and minimum values maybe calculated at the mean-value operator. Alternately, the max-value detector and the min-value detector may also be omitted, and a simple mean of instantaneous values of a positive-side input digital signal within a certain period may be calculated.

Figure 9:
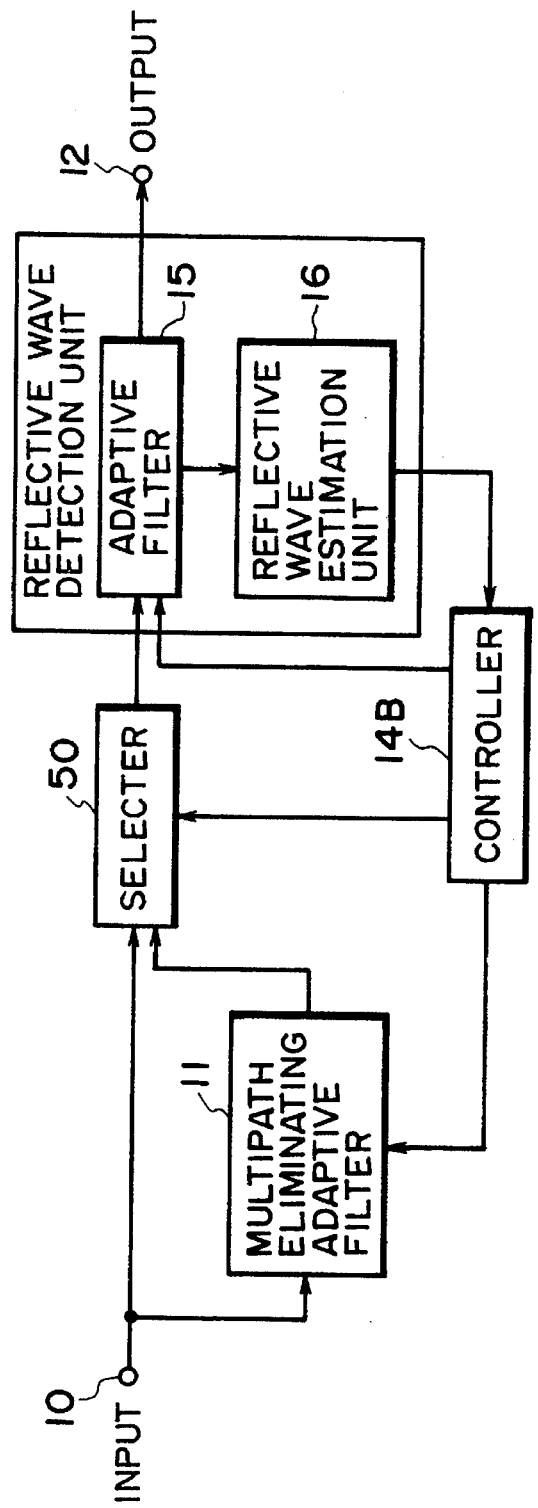
FIG. 9 is a circuit diagram illustrating a multipath eliminating filter according to a third embodiment of the present invention.

FIG. 9 is a partially omitted circuit diagram showing a multipath eliminating filter according to a third embodiment of the present invention. The same component features as in FIG. 1 are denoted by common reference numerals.

Reference numeral 50 denotes a selector which selects the input terminal 10 or an output side of the multipath eliminating adaptive filter 11 for the connection thereof to an input of the adaptive filter 15 of the reflective wave detection unit 13. An output side of the adaptive filter 15 is connected to the output terminal 12. The controller 14B switches the selector 50 for the connection of the same to the input terminal 10 before an adaptive operation of the adaptive filter 15 is started, thus letting an input digital signal enter the adaptive filter 15. Then, when the controller 14B initializes filter characteristics for the multipath eliminating adaptive filter 11 and causes the filter to start an adaptive operation, it switches the selector 50 for the connection of the same to the multipath eliminating adaptive filter 11.

According to an example of FIG. 9, even after the multipath eliminating adaptive filter 11 starts an adaptive operation, the adaptive filter 15 which is cascade connected at a subsequent stage is adapted to continue an adaptive operation. Thus, a multipath component of a shorter delay time remaining in an output from the multipath eliminating adaptive filter 11 can be eliminated at the adaptive filter 15 before output therefrom. As a result, a characteristic of suppressing a multipath component improves.

Figure 10:
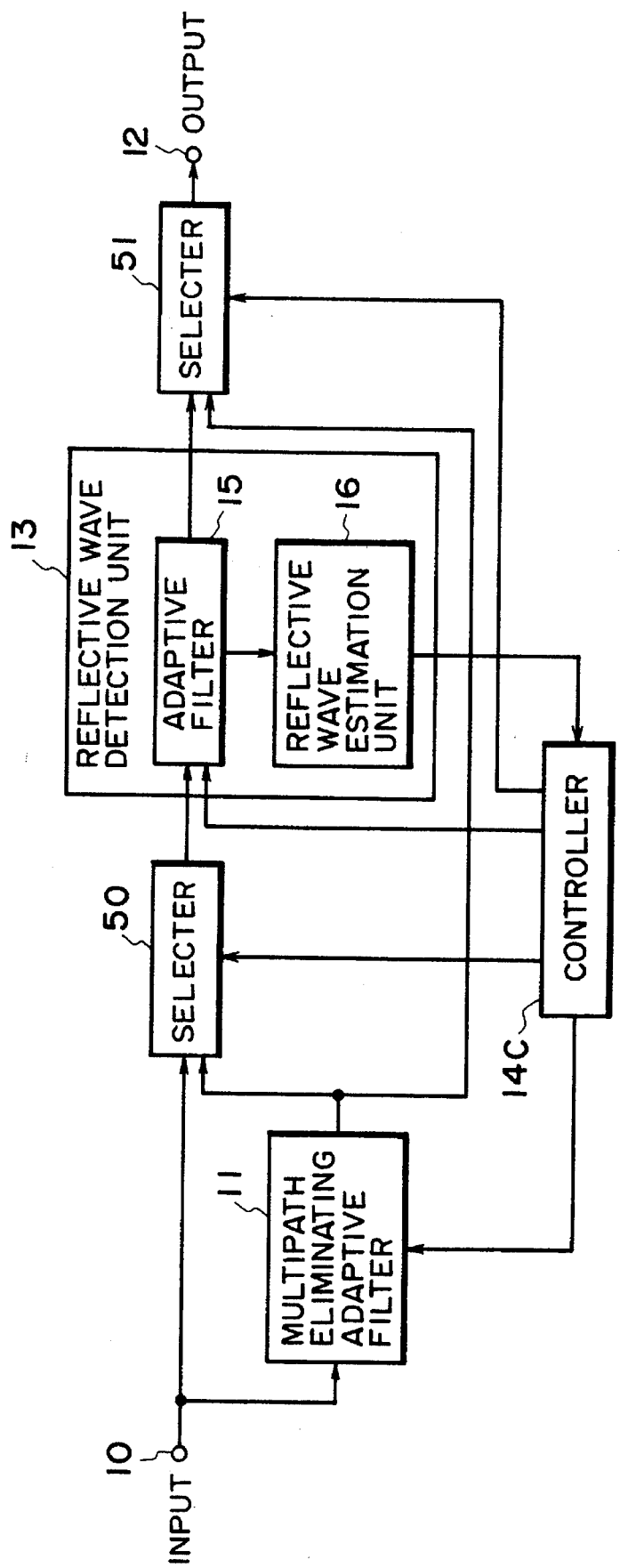
FIG. 10 is a circuit diagram illustrating a modified third embodiment.

In this connection, as shown in FIG. 10, a selector 51 maybe provided on the output side of the multipath eliminating adaptive filter and of the adaptive filter 15. When the selector 50 is switched for the connection of the same to the input terminal 10, a controller 14C may switch the selector 51 for the connection of the same to the multipath eliminating adaptive filter 11. When the controller 14C switches the selector 50 for the connection of the same to the multipath eliminating adaptive filter 11, it may switch, in an interlocking manner, the selector 51 for the connection of the same to the adaptive filter 15.

Figure 11:
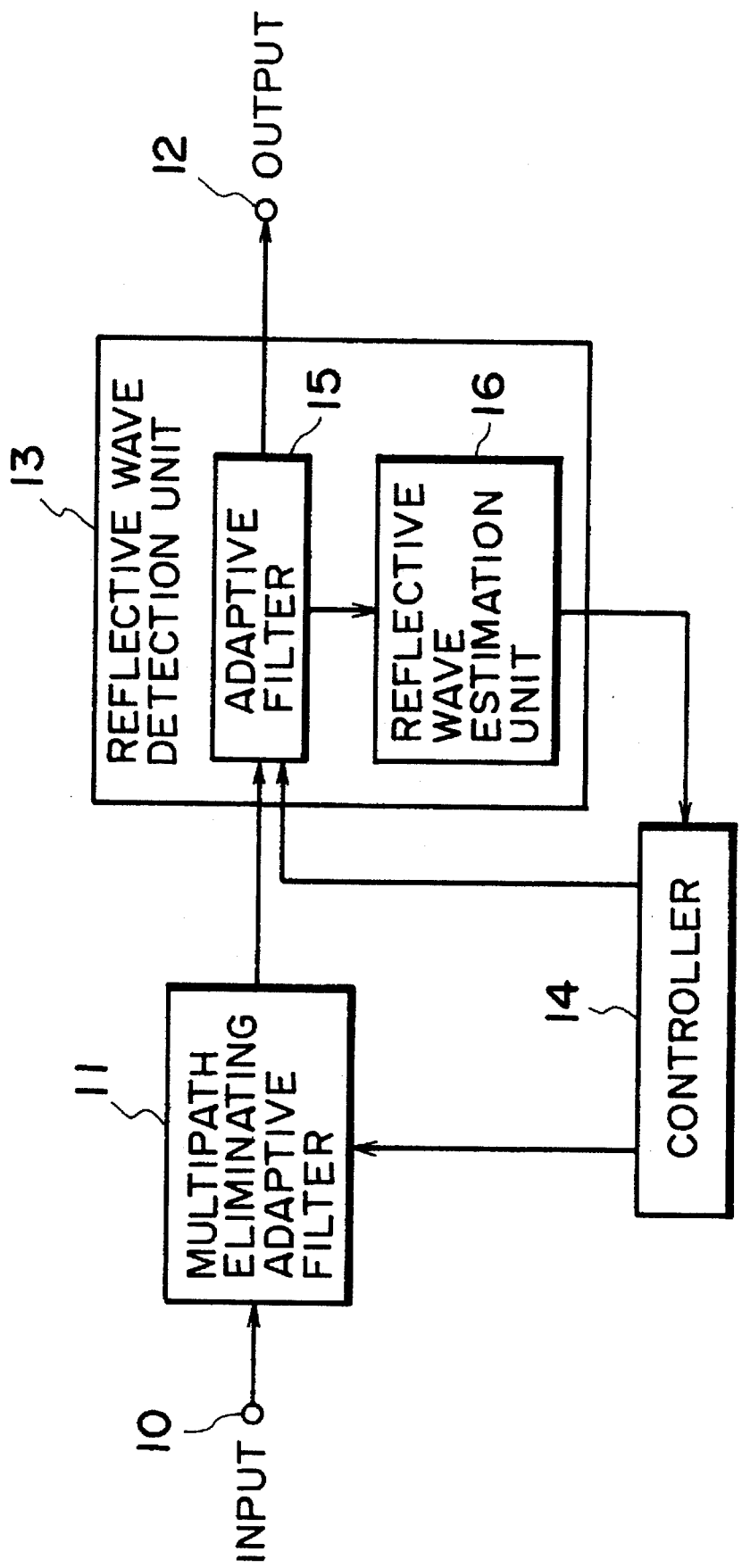
FIG. 11 is a circuit diagram illustrating another modified third embodiment.

Also, as shown in FIG. 11, the adaptive filter 15 is connected to the output side of the multipath eliminating adaptive filter 11, and the output side of the adaptive filter 15 is connected to the output terminal 12. When the adaptive filter 15 is to perform an adaptive operation, if the controller 14 fixes a transfer function of the multipath eliminating adaptive filter 11 to 1, a digital signal inputted to the input terminal 10 is inputted intact to the adaptive filter 15. Thus, characteristics of a reflected wave can be estimated from a filter coefficient obtained when the adaptive filter 15 performs an adaptive operation for a predetermined time. After the multipath eliminating adaptive filter 11 has started an adaptive operation, a multipath component having a short delay time which remains in an output from the multipath eliminating adaptive filter 11 can be removed at the adaptive filter 15 before output.

Figure 12:
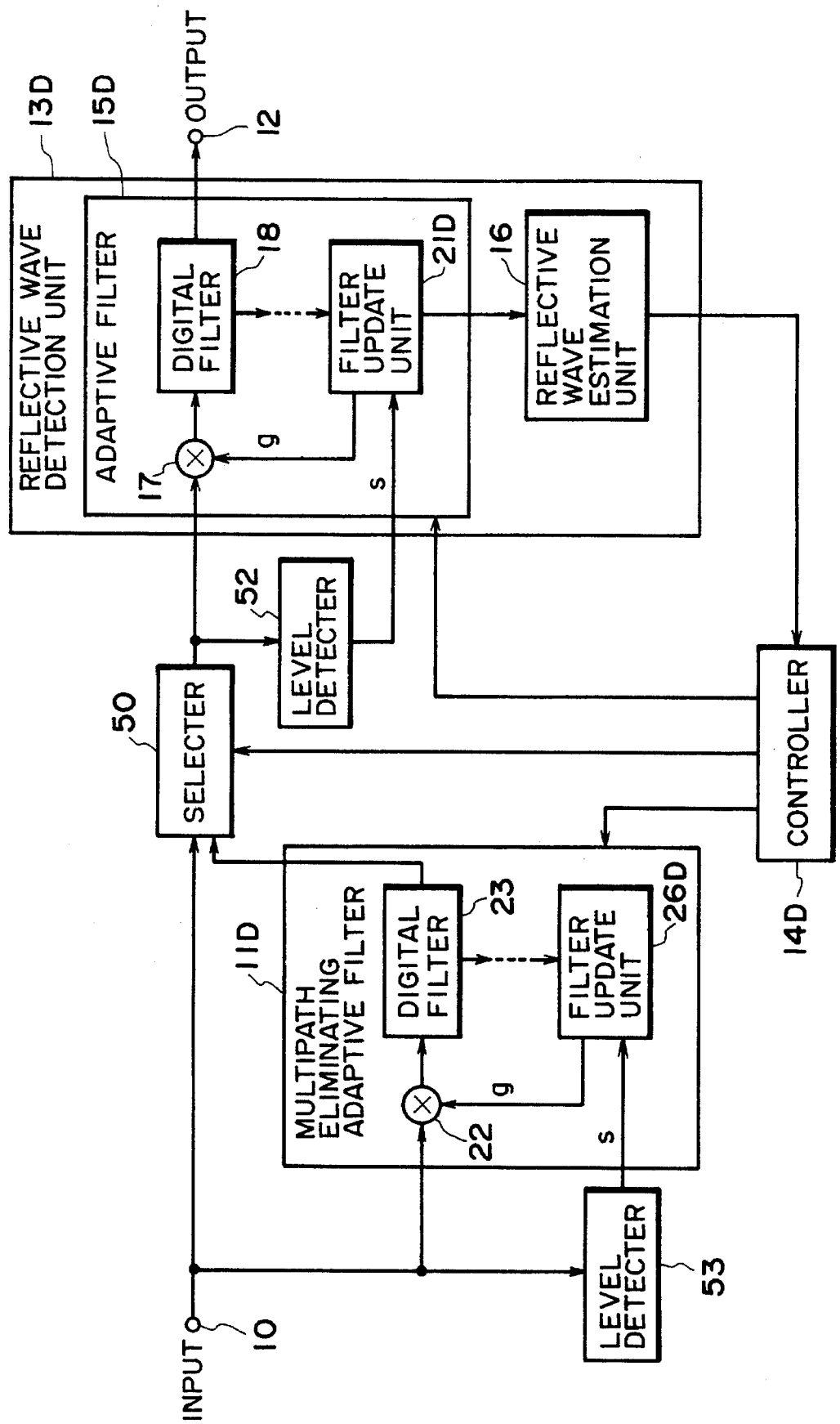
FIG. 12 is a circuit diagram illustrating a further modified third embodiment.

As shown in FIG. 12, a level detector 52 may be provided, as in the second embodiment, for detecting a level of a digital signal to be inputted to the adaptive filter 15D of the reflective wave detection unit 13D. In the sate that the selector 50 is initially switched for the connection of the same to the input terminal 10, when an adaptive filter 15D starts an adaptive operation, a filter update unit 21D initializes the multiplier 17 to gain coefficient g=1/s based on level s of a digital signal inputted from the level detector 52. Also, when the selector 50 is switched for the connection of the same to a multipath eliminating adaptive filter 11D and also when the multipath eliminating adaptive filter 11D starts an adaptive operation, the filter update unit 21D initializes the multiplier 17 to gain coefficient g=1/s based on level s of a digital signal inputted from the level detector 52. Also, a level detector 53 may be provided for detecting a level of a digital signal to be inputted to the multipath eliminating adaptive filter 11D. When an adaptive operation of the multipath eliminating adaptive filter 11D is started, a filter update unit 26D initializes the multiplier 22 to gain coefficient g=1/s based on level s of a digital signal inputted from the level detector 53.

In FIG. 12, in the sate that the selector 50 is initially switched for the connection of the same to the input terminal 10, when the adaptive filter 15D is to start an adaptive operation, the filter update unit 21D initializes the multiplier 17 to gain coefficient g=1/s based on level s of a digital signal inputted from the level detector 53. Also, when the selector 50 is switched for the connection of the same to the multipath eliminating adaptive filter 11D and also when the multipath eliminating adaptive filter 11D starts an adaptive operation, the multipath eliminating adaptive filter 11D inputs a gain adjusted digital signal to the adaptive filter 15D. Thus, the level detector 52 can be omitted by adapting the multiplier 17 so as to be initialized merely to gain coefficient g=1, not g=1/s.

Figure 13:
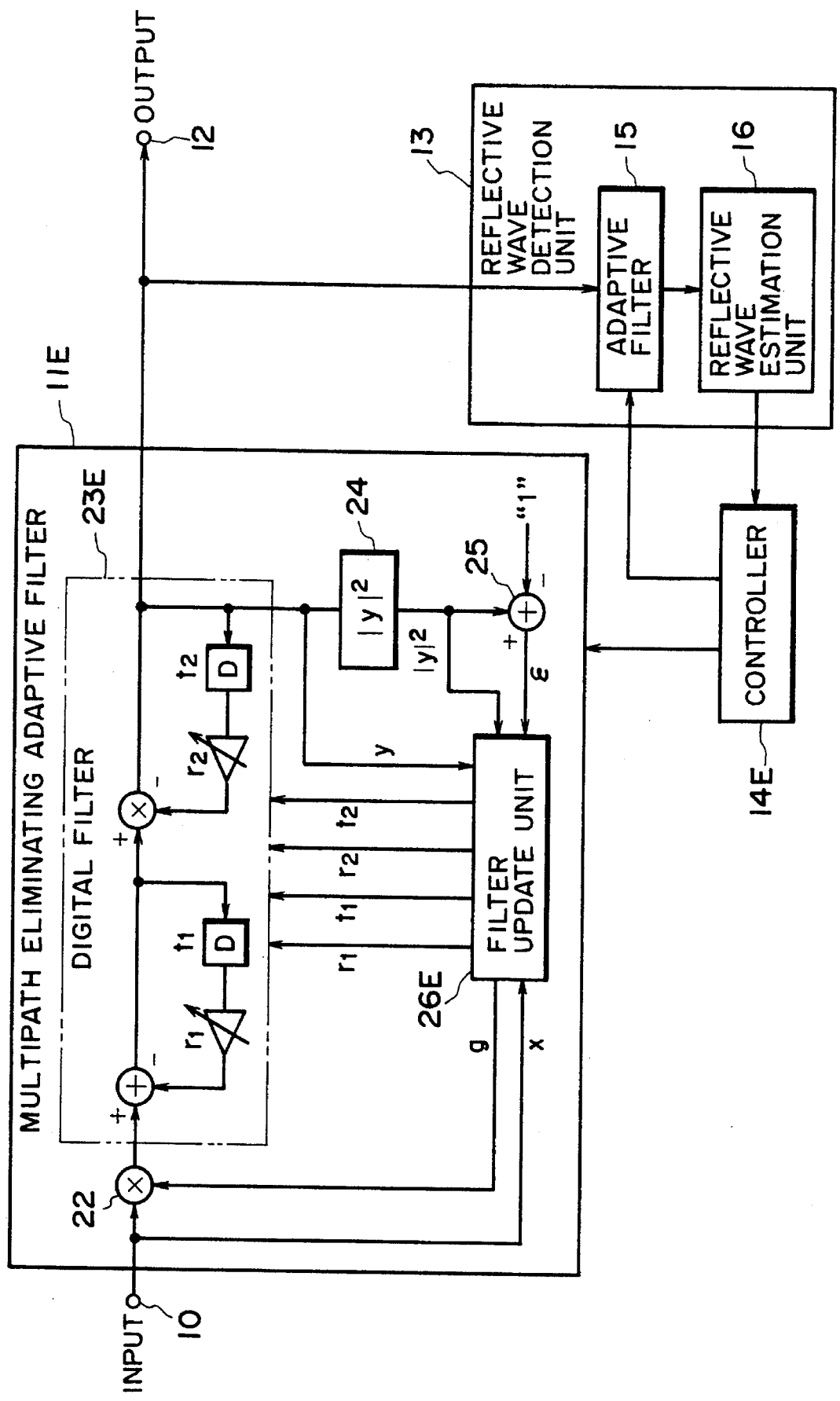
FIG. 13 is a circuit diagram illustrating a multipath eliminating filter according to a fourth embodiment of the present invention.

FIG. 13 is a circuit diagram showing a multipath eliminating filter according to a fourth embodiment of the present invention. In this fourth embodiment, a digital filter 23E of a multipath eliminating adaptive filter 11E comprises IIR filters of first degree which are cascade connected in two stages. This permits initialization to be performed twice, separately for the first stage and for the second stage. Thus, a multipath component can be eliminated even in the case of a plurality of reflected waves. An output from the multipath eliminating adaptive filter is inputted to the adaptive filter 15.

Initially, a controller 14E sets gain coefficient g of the multiplier 22 for level adjustment of the multipath eliminating adaptive filter 11E to 1, and multiplication coefficient $r_1$ of a multiplication element of the IIR filter of first degree at the first stage and multiplication coefficient $r_2$ of a multiplication element of the IIR filter of first degree at the second stage to 0. The controller 14E runs the multipath eliminating adaptive filter 11E with its transfer function fixed to 1. Also, the controller 14E initializes the multiplier 17 for level adjustment of the adaptive filter 15 to gain coefficient g=1, and the digital filter 18 to filter coefficient $C=[c_0=1, c_2=0, c_3=0, \ldots, c_N=0]$. Furthermore, it initializes the filter update unit 21 to the same filter coefficient value. Then, it causes the adaptive filter 15 to start an adaptive operation. After the elapse of a predetermined time, the reflective wave estimation unit 16 selects a filter coefficient having a maximum absolute value except co from among those of the digital filter 18 to estimate reflection coefficient r and delay time t. Taking the estimated values in, the controller 14E initializes the delay element and multiplication element of the IIR filter of first degree at the first stage of the digital filter 23E to $r_1=r$ and $t_1=t$ as initial filter characteristics of the first stage, and also initializes a filter update unit 26E to the initial filter characteristics of the first stage. Then, the controller 14E causes the multiplier 22 of the multipath eliminating adaptive filter 11E to start and the IIR filter of first degree at the first stage of the digital filter 23E to start an adaptive operation.

Subsequently, the controller 14E initializes again the multiplier 17 for level adjustment of the adaptive filter 15 to gain coefficient g=1 and the digital filter 18 to filter coefficient $C=[c_0=1, c_2=0, c_3=0, \ldots, c_N=0]$. Also, it initializes the filter update unit 21 to the same filter coefficient value, and then causes the adaptive filter 15 to performance adaptive operation. Since a reflected wave having a largest reflection coefficient is eliminated at the multipath eliminating adaptive filter 11E, the adaptive filter 15 carries out an adaptive operation so as to eliminate other reflected waves. After the elapse of a predetermined time, the reflective wave estimation unit 16 selects a filter coefficient having a maximum absolute value except $c_0$ from among those of the digital filter 18 to estimate reflection coefficient r and delay time t. Taking the estimated values in, the controller 14E initializes the delay element and multiplication element of the IIR filter of first degree at the second stage of the digital filter 23E to $r_2=r$ and $t_2=t$ as initial filter characteristics of the second stage, and also initializes the filter update unit 26E to the initial filter characteristics of the second stage. Then, the controller 14E causes the IIR filter of first degree at the second stage of the multipath eliminating adaptive filter 11E to start an adaptive operation.

As a result, it is possible to eliminate one reflected wave component having a largest reflection coefficient at the IIR filter of first degree at the first stage of the digital filter 23E and to eliminate one reflected wave component having a second largest reflection coefficient at the IIR filter of first degree at the second stage.

Update expressions for filter characteristics to be executed at the filter update unit 26E will now be described.

Considering the first and second stages of the digital filter 23E as an FIR filter having filter coefficient $C_1=[c_{10}, c_{11}, c_{12}, \ldots, C_{1L}]$ and an FIR filter having $C_2=[c_{20}, c_{21}, c_{22}, \ldots, c_{2L}]$, respectively, and the whole digital filter 23E as an FIR filter having filter coefficient $C=[c_0, c_1, c_2, \ldots, c_L]$, C can be represented by a convolution of $C_1$ and $C_2$ as below because C is an impulse response of the digital filter 23E.

$$C = C1 * C2 \tag{7}$$

$$c_k = \sum_{i=0}^{N} c_{1i} c_{2(k-i)}$$

where "*" indicates a calculation of convolution.

From the above-mentioned method of initialization, $|r_1|>|r_2|$, and filter coefficient $c_{1k}$ of the first stage is greater than filter coefficient $c_{2k}$ of the second stage as a whole. Hence, combination terms in expression (7) can be omitted to make an approximation with $C=C_1+C_2$.

As in the first embodiment, update expressions for filter characteristics can be represented by $$g \leftarrow g - \beta_1(\partial F/\partial g) = g - 4\beta_1\epsilon_n(|y_n|^2/g) \tag{8}$$

$$\approx g - 4\beta_1\epsilon_n|y_n|^2 \tag{8}'$$

$$r_1 \leftarrow r_1 - \beta_2(\partial F/\partial r_1) = r_1 - 4\beta_2\epsilon_n y_n(gX^T\partial C1/\partial r_1)^* \tag{9}$$

$$t_1 \leftarrow t_1 - \beta_3(\partial F/\partial t_1) = t_1 - 2\beta_3\epsilon_n R_e\{y_n*(gC_1^T(\partial X/\partial t_1))\} \tag{10}$$

$$r_2 \leftarrow r_2 - \beta_4(\partial F/\partial r_1) = r_2 - 4\beta_4\epsilon_n y_n(gX^T\partial C_2/\partial r_2)^* \tag{11}$$

$$t_2 \leftarrow t_2 - \beta_5(\partial F/\partial t_2) = t_2 - 2\beta_5\epsilon_n R_e\{y_n*(gC_2^T(\partial X/\partial t_2))\} \tag{12}$$

$\beta_1-\beta_5$ are convergence parameters.

$\partial c_1/\partial r_1$ in expression (9) is represented by $$\partial c_{1k}/\partial r_1=-p (-r_1)^{p-1}\ k=p$$

$$\partial c_{1k}/\partial r_1=0\ k \neq p$$

$\partial C_2/\partial r_2$ in expression (11) is represented by $$\partial c_{2k}/\partial r_2=-p (-r_2)^{p-1}\ k=0$$

$$\partial c_{2k}/\partial r_2=0\ k \neq p$$

With a unit delay time of a delay element in an FIR filter taken as u, p=[vt/u] (v is a variable assuming an integer greater than 0), a maximum integer not exceeding vt/u.

$\partial x_k/\partial t_1$ in expression (10) and $\partial x_k/\partial t_2$ in expression (12) are represented by $$\partial x_k/\partial t_1 \approx (k/2t_1)\ (x_{k+1}-x_{k-1})$$

$$\partial x_k/\partial t_2 \approx (k/2t_2)\ (x_{k+1}-x_{k-1})$$

During an adaptive operation by the IIR filter of first degree at the first stage, the filter update unit 26E updates gain coefficient g of the multiplier 22 according to expression (8) or (8)', updates multiplication coefficient $r_1$ of a multiplication element of and delay time $t_1$ of a delay element of the IIR filter of first degree at the first stage according to expressions (9) and (10), respectively, and holds multiplication coefficient $r_2$ of a multiplication element of the IIR filter of first degree at the second stage 0. Also, during an adaptive operation by the IIR filters of first degree at the first and second stages, the filter update unit 26E updates gain coefficient g of the multiplier 22 according to expression (8) or (8)', updates multiplication coefficient $r_1$ of a multiplication element of and delay time $t_1$ of a delay element of the IIR filter of first degree at the first stage according to expressions (9) and (10), respectively, and updates multiplication coefficient $r_2$ of a multiplication element of and delay time $t_2$ of a delay element of the IIR filter of first degree at the second stage according to expressions (11) and (12), respectively.

Figure 14:
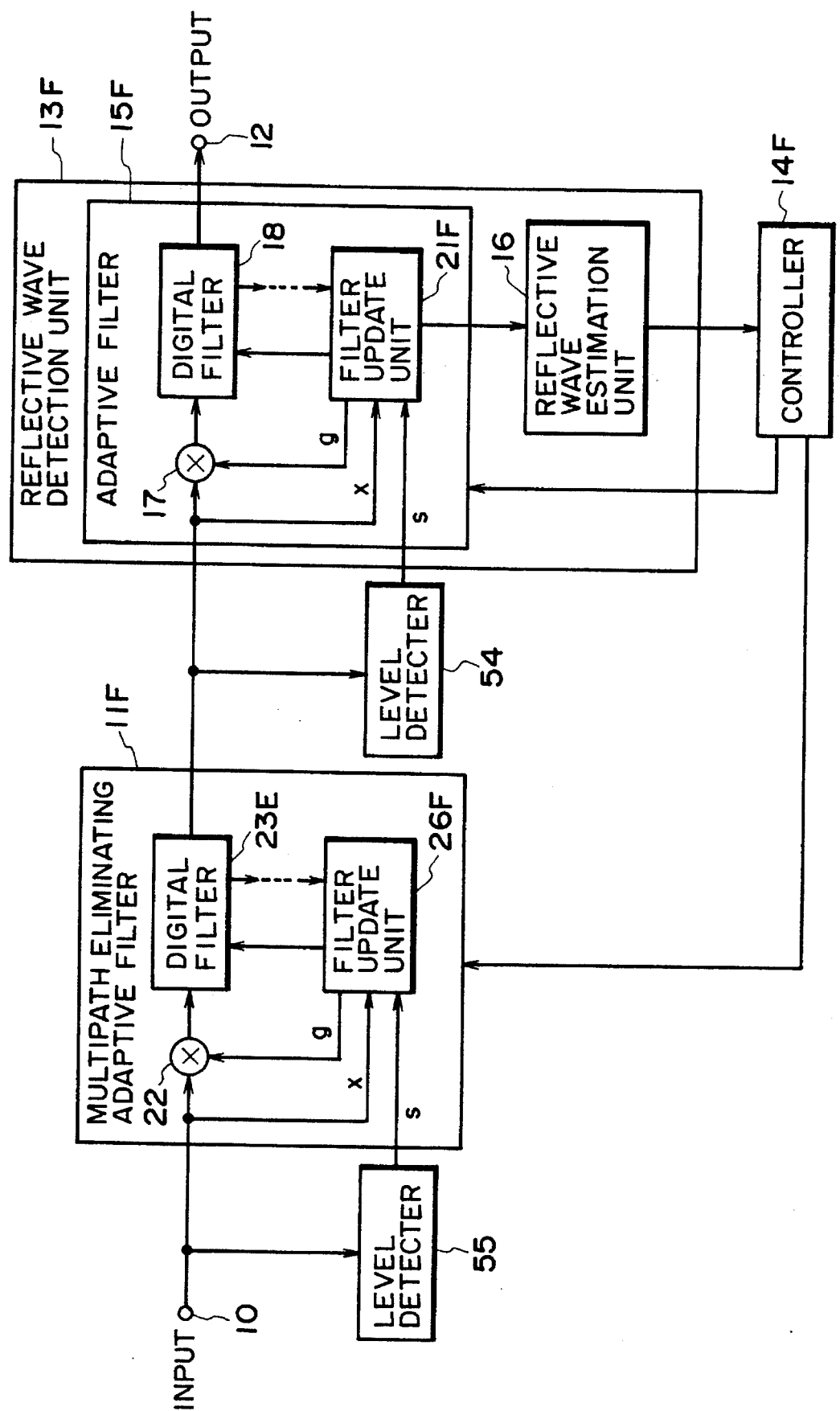
FIG. 14 is a circuit diagram illustrating a modified fourth embodiment.

FIG. 14 is a circuit diagram showing a modified fourth embodiment.

In this modified embodiment, a level detector 54 is provided for detecting a level of a digital signal to be inputted to an adaptive filter 15F of a reflective wave detection unit 13F, and also a level detector 55 is provided for detecting a level of a digital signal to be inputted to a multipath eliminating adaptive filter 11F. An output of the adaptive filter 15F is connected to the output terminal 12.

After a controller 14F initializes an IIR filter of first degree at the second stage of the multipath eliminating adaptive filter 11F and causes an adaptive operation including that of the second stage to start, it initializes again the digital filter 18 of the adaptive filter 15F and the filter update unit 21F to filter coefficient $C=[c_0=1, c_2=0, c_3=0, \ldots, c_N=0]$ and has an adaptive operation continue. Thus, a remaining reflected wave component which the multipath eliminating adaptive filter 11F has failed to eliminate is eliminated at the adaptive filter 15F.

The filter update unit 21F initializes the multiplier 17 to gain coefficient $g=1/s$ based on level s of a digital signal inputted from the level detector 54 and then updates filter characteristics at each point of time when the adaptive filter 15F starts an adaptive operation in order to detect reflected wave characteristics of the first time, when the adaptive filter 15F starts an adaptive operation in order to detect reflected wave characteristics of the second time, and when the multipath eliminating adaptive filter 11F starts an adaptive operation at the IIR filter of first degree at the second stage.

Likewise, when the multipath eliminating adaptive filter 11F starts an adaptive operation at the IIR filter of first degree at the first stage, the filter update unit 26F initializes the multiplier 22 to gain coefficient $g=1/s$ based on level s of a digital signal which is inputted at that point of time from the level detector 55 and then updates filter characteristics.

According to an example of FIG. 14, even when three or more reflected waves are involved, a quick convergence is established, and multipath can be securely eliminated.

Figure 15:
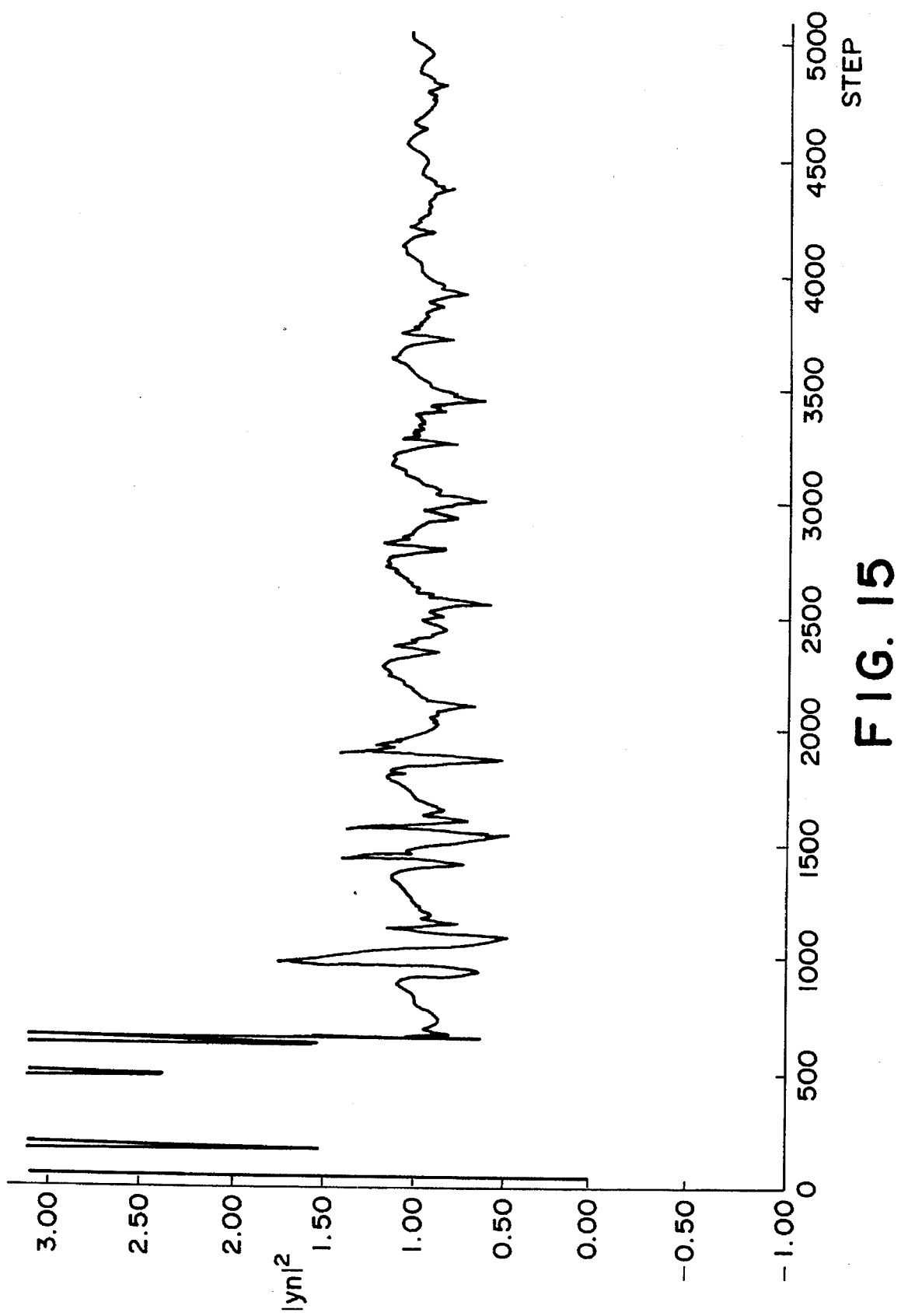
FIG. 15 is a graph illustrating the result of experiment of the multipath eliminating filter of FIG. 14.

FIG. 15 shows how $|y_n|^2$ changes at the output terminal 12 of the multipath eliminating filter of FIG. 2 having the construction of FIG. 14 when an FM modulated wave of a 1 kHz sine wave monaural signal, together with four reflected waves, is received. Also, FIG. 6 shows how a demodulated output from the digital demodulator 34 changes.

Conditions established here are as follows: sampling frequency of the A/D converter 32=912 kHz; reflection coefficient r of a first reflected wave= 0.32; delay time=8 sampling periods; reflection coefficient r of a second reflected wave=0.25; delay time=12 sampling periods; reflection coefficient r of a third reflected wave=0.20; delay time=15 sampling periods; reflection coefficient r of a fourth reflected wave=0.16; delay time=19 sampling periods; and an amplitude of a direct wave is +10 dB with respect to a reference amplitude value. The reflective wave estimation unit 21F estimates characteristics of a reflected wave based on a filter coefficient of the adaptive filter 15F at a point of time after the elapse of 600 steps after the adaptive filter 15F has started an adaptive operation. Based on the estimated values, the controller 14F initializes the multipath eliminating adaptive filter 11.

Figure 16:
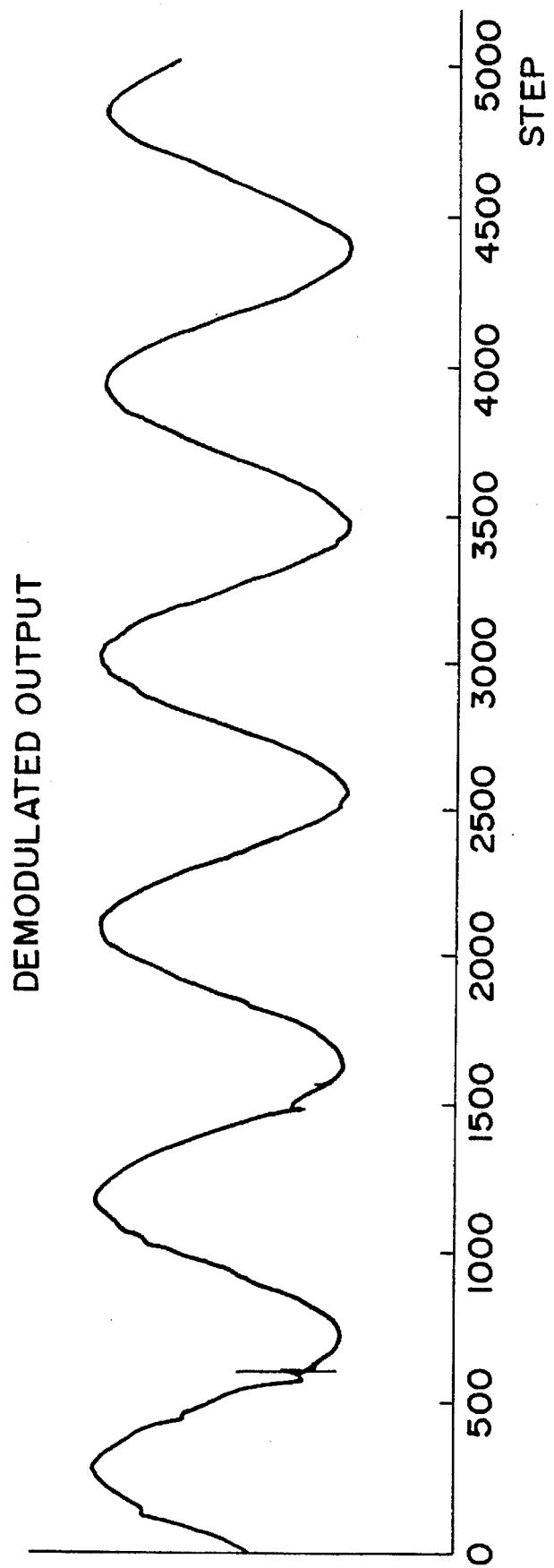
FIG. 16 is a graph illustrating the result of experiment of the multipath eliminating filter of FIG. 14.

As seen from FIGS. 15 and 16, multipath is not eliminated completely, but multipath distortion is corrected at and after around step 2500.

In examples of FIGS. 13 and 14, if the digital filter of the multipath eliminating adaptive filter comprises IIR filters of first degree in three or more stages and if initialization is sequentially made for the stages, the case of many reflected waves involved can be coped with.

Also, if update expressions for filter characteristics are used without omitting combination terms in expression (7), a convergence characteristic can be improved.

Furthermore, in an example of FIG. 14, when the adaptive filter 15F starts an adaptive operation in order to detect reflected wave characteristics of the first time, the filter update unit 21F initializes the multiplier 17 to gain coefficient $g=1/s$ based on level s of a digital signal inputted from the level detector 55. At each point of time when the adaptive filter 15F starts an adaptive operation in order to detect reflected wave characteristics of the second time and when the multipath eliminating adaptive filter 11F starts an adaptive operation at the IIR filter of first degree at the second stage, since a gain adjusted digital signal from the multipath eliminating adaptive filter 11F is inputted to the adaptive filter 15F, the level detector 54 can be omitted by adapting the multiplier 17 so as to be initialized merely to gain coefficient $g=1$, not $g=1/s$.

In the above-mentioned embodiments and modified embodiments, a reference amplitude value is taken as 1. However, it may be other than 1, if fixed. When a reference amplitude value is taken as value w other than 1, a multiplier for level adjustment may be initialized to gain coefficient $g=s/w$ based on detected level s of a digital signal.

Also, an amplifier for level adjustment is inserted on the input side of a digital filter. However, as described in literature 3, the amplifier may be inserted before or after an operator which calculates $|y_n|^2$.

Furthermore, the following practice may be followed. After causing a multipath eliminating adaptive filter to start an adaptive operation, a controller monitors a magnitude of $|y_n|^2$ and $\epsilon_n$ at the multipath eliminating adaptive filter (or adaptive filter). When the magnitude exceeds a predetermined value, the controller causes a reflective wave detection unit to detect reflected wave characteristics at that point of time. Based on the result of the detection, the controller re-initializes the multipath eliminating adaptive filter and causes it to re-execute an adaptive operation.

Also, an application object of the present invention is not limited to FM modulated waves, but the invention is likewise applicable to other modulation systems featuring a fixed amplitude such as phase modulated waves and the like.

ADVANTAGE OF THE INVENTION

According to an aspect of the present invention, characteristics of a reflected wave are detected from an input digital signal or an output digital signal of a multipath eliminating adaptive filter. A digital filter of the multipath eliminating adaptive filter is initialized to initial filter characteristics corresponding to the detected characteristics of a reflected wave before starting an adaptive operation of the multipath eliminating adaptive filter. Thus, it is possible for the multipath eliminating adaptive filter to start a filter arithmetic under an appropriate initial state suited to characteristics of a reflected wave. Also, an amplitude of a digital signal output is converged quickly and securely to a predetermined value, thereby obtaining a reception output with a multipath component eliminated therefrom.

According to another aspect of the present invention, an input digital signal or an output digital signal from the multipath eliminating adaptive filter is led to an adaptive filter for estimating characteristics of a reflected wave from filter characteristics of a digital filter of the adaptive filter at a point of time when an error between an output amplitude of the adaptive filter and a reference amplitude value becomes small to a certain extent. Since the adaptive filter used for estimating characteristics of a reflected wave is not intended to eliminate multipath distortion, but is intended to estimate characteristics of a reflected wave, it adapts itself to a smaller circuit scale and can be implemented in a simple construction.

According to a further aspect of the present invention, a level of a digital signal to be inputted to the multipath eliminating adaptive filter is detected, and level adjustment means of the multipath eliminating adaptive filter is to be initialized to a level adjustment amount inversely proportional to the level of a digital signal when an adaptive operation of the multipath eliminating adaptive filter is started. Thus, an adaptive operation of the multipath eliminating adaptive filter can be started at an appropriate initial amount of level adjustment. Also, convergence can be attained in a short period of time even when the difference between an amplitude of a direct wave and a reference amplitude is large.

According to still another aspect of the present invention, a level of a digital signal to be inputted to reflective wave detection means is detected, and level adjustment means of an adaptive filter of the reflective wave detection means is initialized to a level adjustment amount inversely proportional to the level of a digital signal when an adaptive operation of the adaptive filter of the reflective wave detection means is to be started. Thus, an adaptive operation of the adaptive filter can be started at an appropriate initial amount of level adjustment. Also, even when the difference between an amplitude of a direct wave and a reference amplitude is large, characteristics of a deflected wave can be detected in a short period of time, and the multipath eliminating adaptive filter can be initialized accordingly before starting an adaptive operation.

According to a still further aspect of the present invention, the adaptive filter of the reflective wave detection means is cascade connected to the multipath eliminating adaptive filter at a subsequent stage thereto after an adaptive operation of the multipath eliminating adaptive filter is started. Thus, a remaining reflected wave component which the multipath eliminating adaptive filter has failed to eliminate can be eliminated by the adaptive filter of the reflective wave detection means.

According to a still further aspect of the present invention, the digital filter of the multipath eliminating adaptive filter comprises an IIR filter of first degree in single stage or IIR filters of first degree which are cascade connected in more than one stage. Thus, a circuit scale can be greatly reduced.

What is claimed is:

1. A multipath eliminating filter, characterized by comprising:

a multipath eliminating adaptive filter comprising: a digital filter having variable filter characteristics to which a frequency modulated or phase modulated digital signal containing a multipath component is inputted and which performs a filter arithmetic process on the input digital signal to eliminate the multipath component therefrom; error detection means for obtaining an error between an amplitude of a digital signal outputted from the digital filter and a reference amplitude value; level adjustment means allowing an amount of adjustment to be varied for adjusting an amplitude level of the input digital signal; and update means which calculates filter characteristics and the amount of level adjustment for minimizing an error detected by the error detection means and which updates filter characteristics for the digital filter and the amount of level adjustment for the level adjustment means;

reflective wave detection means for detecting characteristics of a reflected wave from the input digital signal or an output digital signal of said multipath eliminating adaptive filter; and control means which initializes the digital filter of said multipath eliminating adaptive filter to initial filter characteristics corresponding to characteristics of the reflected wave detected by said reflective wave detection means and which starts an adaptive operation at said multipath eliminating adaptive filter.

2. A multipath eliminating filter according to claim 1, characterized in that said reflective wave detection means comprises:

an adaptive filter comprising: a digital filter having variable filter characteristics which performs a filter arithmetic process on tile input digital signal or the output digital signal of said multipath eliminating adaptive filter; error detection means for obtaining an error between an amplitude of a digital signal outputted from the digital filter and a reference amplitude value; level adjustment means allowing the amount of adjustment to be varied for adjusting an amplitude level of the input digital signal; and update means which calculates filter characteristics and the amount of level adjustment for minimizing an error detected by tile error detection means and which updates filter characteristics for the digital filter and an amount of level adjustment the level adjustment means; and reflective wave estimating means for estimating characteristics of a reflected wave from filter characteristics of the digital filter of said adaptive filter at a point of time when an error in said adaptive filter becomes small to a certain extent.

3. A multipath eliminating filter according to claim 1, characterized by comprising:

level detection means for detecting a level of the digital signal to be inputted to said multipath eliminating adaptive filter; and level adjustment amount initialization means for initializing, when an adaptive operation of said multipath eliminating adaptive filter is to be started, the level adjustment means of said multipath eliminating adaptive filter to an amount of level adjustment inversely proportional to a level of a digital signal detected by said level detection means.

4. A multipath eliminating filter according to claim 2, characterized by comprising:

level detection means for detecting a level of the digital signal to be inputted to said reflective wave detection means; and level adjustment amount initialization means for initializing, when an adaptive operation of the adaptive filter of said reflective wave detection means is to be started, the level adjustment means of said adaptive filter to an Mount of level adjustment inversely proportional to a level of a digital signal detected by said level detection means.

5. A multipath eliminating filter according to claim 2, characterized by comprising connection selector means for cascade connecting the adaptive filter of said reflective wave detection means to said multipath eliminating adaptive filter at a subsequent stage thereto after an adaptive operation of said multipath eliminating adaptive filter is started.

6. A multipath eliminating filter according to claim 1, characterized in that the digital filter of said multipath eliminating adaptive filter comprises an infinite impulse response filter of first degree in single stage or infinite impulse response filters of first degree which are cascade connected in more than one stage.

\* \* \* \* \*